US012751224B2

(12) United States Patent
Xiao et al.

(10) Patent No.: US 12,751,224 B2
(45) Date of Patent: Sep. 29, 2026

(54) ALKOXYDISILOXANES AND DENSE ORGANOSILICA FILMS MADE THEREFROM

(71) Applicant: VERSUM MATERIALS US, LLC, Tempe, AZ (US)

(72) Inventors: Manchao Xiao, San Diego, CA (US); Daniel P. Spence, Carlsbad, CA (US); Xinjian Lei, Vista, CA (US); William Robert Entley, Gilbert, AZ (US); Raymond Nicholas Vrtis, Carlsbad, CA (US); Jennifer Lynn Anne Achtyl, Chandler, AZ (US); Robert Gordon Ridgeway, Chandler, AZ (US)

(73) Assignee: Versum Materials US, LLC, Tempe, AZ (US)

( * ) Notice: Subject to any disclaimer, the term of this patent is extended or adjusted under 35 U.S.C. 154(b) by 486 days.

(21) Appl. No.: 18/249,831

(22) PCT Filed: Oct. 20, 2021

(86) PCT No.: PCT/US2021/055879
§ 371 (c)(1),
(2) Date: Apr. 20, 2023

(87) PCT Pub. No.: WO2022/087151
PCT Pub. Date: Apr. 28, 2022

(65) Prior Publication Data
US 2023/0386825 A1 Nov. 30, 2023

Related U.S. Application Data

(60) Provisional application No. 63/094,183, filed on Oct. 20, 2020.

(51) Int. Cl.
*H01L 21/02* (2006.01)
*C07F 7/08* (2006.01)
(Continued)

(52) U.S. Cl.
CPC ........ *H10P 14/6922* (2026.01); *C07F 7/0838* (2013.01); *C07F 7/0896* (2013.01);
(Continued)

(58) Field of Classification Search
None
See application file for complete search history.

(56) References Cited

U.S. PATENT DOCUMENTS

| | | |
|---|---|---|
| 2,967,171 A | 1/1961 | Barnes, Jr. et al. |
| 6,054,206 A | 4/2000 | Mountsier |

(Continued)

FOREIGN PATENT DOCUMENTS

| | | |
|---|---|---|
| CN | 105401131 A | 3/2016 |
| EP | 0340637 A2 | 11/1989 |

(Continued)

OTHER PUBLICATIONS

Vasilikogiannaki et al., Efficient hydrosilylation of carbonyl compounds by 1,1,3,3—tetramethyldisiloxane catalyzed by Au/TiO2, Tetrahedron 70 (2014) 6106-6113. (Year: 2014).*

(Continued)

*Primary Examiner* — Asok K Sarkar
(74) *Attorney, Agent, or Firm* — Versum Materials US, LLC; David K. Benson

(57) ABSTRACT

A method for making a dense organosilicon film with improved mechanical properties includes the steps of: providing a substrate within a reaction chamber; introducing into the reaction chamber a gaseous composition comprising alkoxydisiloxane; and applying energy to the gaseous composition comprising alkoxydisiloxane in the reaction chamber to induce reaction of the gaseous composition comprising alkoxydisiloxane to deposit an organosilicon film on the substrate, wherein the organosilicon film has a dielectric constant of from ~2.50 to ~3.30, an elastic modulus of from (Continued)

~6 to ~35 GPa, and an at. % carbon of from ~10 to ~40 as measured by XPS.

23 Claims, 6 Drawing Sheets

(51) Int. Cl.

| | |
|---|---|
| ***C08G 77/12*** | (2006.01) |
| ***C09D 183/04*** | (2006.01) |
| ***H10P 14/60*** | (2026.01) |
| ***H10P 14/692*** | (2026.01) |

(52) U.S. Cl.

CPC ........... *C08G 77/12* (2013.01); *C09D 183/04* (2013.01); *H10P 14/6334* (2026.01); *H10P 14/6336* (2026.01); *H10P 14/6686* (2026.01)

(56) References Cited

U.S. PATENT DOCUMENTS

| | | | | |
|---|---|---|---|---|
| 6,171,945 | B1 | 1/2001 | Mandal et al. | |
| 6,238,751 | B1 | 5/2001 | Mountsier | |
| 6,312,793 | B1 | 11/2001 | Grill et al. | |
| 6,583,049 | B2 | 6/2003 | Suzuki et al. | |
| 7,749,920 | B2 | 7/2010 | Sakurai et al. | |
| 9,922,818 | B2 | 3/2018 | Vrtis et al. | |
| 2003/0224156 | A1 | 12/2003 | Kirner et al. | |
| 2006/0079099 | A1 | 4/2006 | Nguyen et al. | |
| 2007/0009673 | A1 | 1/2007 | Fukazawa et al. | |
| 2009/0181178 | A1* | 7/2009 | Edelstein | H10F 30/221 427/447 |
| 2011/0113184 | A1 | 5/2011 | Chu | |
| 2011/0151677 | A1 | 6/2011 | Wang et al. | |
| 2012/0190212 | A1 | 7/2012 | Samukawa et al. | |
| 2016/0049293 | A1 | 2/2016 | Li et al. | |
| 2020/0075321 | A1 | 3/2020 | Mukherjee et al. | |
| 2020/0165727 | A1* | 5/2020 | Li | H01L 21/02214 438/780 |

FOREIGN PATENT DOCUMENTS

| | | | |
|---|---|---|---|
| EP | 1037275 | A1 | 9/2000 |
| EP | 1119035 | A2 | 7/2001 |
| EP | 1342809 | A1 | 9/2003 |
| EP | 1396884 | A2 | 3/2004 |
| EP | 1583142 | A2 | 10/2005 |
| JP | 2002-164346 | A | 6/2002 |
| JP | 2004-312004 | A | 11/2004 |
| JP | 2009-033028 | A | 2/2009 |
| JP | 2016-042576 | A | 3/2016 |
| TW | 201934562 | A | 9/2019 |
| WO | 00/24050 | A1 | 4/2000 |
| WO | 2020/046980 | A1 | 3/2020 |
| WO | 2022/087151 | A1 | 4/2022 |

OTHER PUBLICATIONS

Grill, A. Patel, V. Appl. Phys. Lett. (2001), 79(6), pp. 803-805.

"Extended European Search Report received for European Patent Application No. 21883818.3 mailing date Apr. 23, 2024", 10 Pages.

Bayer, et al., "Overall kinetics of SiOx remote-PECVD using diVerent organosilicon monomers", Surface and Coatings Technology, vols. 116-119,, Sep. 30, 1999, pp. 874-878.

"International Preliminary Report on Patentability received for PCT Application No. PCT/US2021/055879, mailing date May 4, 2023", 8 Pages.

"International Search Report and Written Opinion received for PCT Application No. PCT/US2021/055879, mailing date Feb. 11, 2022", 12 Pages.

* cited by examiner

ALKOXYDISILOXANES AND DENSE ORGANOSILICA FILMS MADE THEREFROM

CROSS-REFERENCE TO RELATED APPLICATIONS

This application is a National Stage filing under 37 U.S.C. 371 of International Patent Application No. PCT/US2021/055879, filed Oct. 20, 2021, which claims the benefit of U.S. Provisional Patent Application No. 63/094,183, filed Oct. 20, 2020. Both applications are hereby incorporated by reference in their entirety.

BACKGROUND OF THE INVENTION

Described herein is a composition and method for formation of a dense organosilica dielectric film using alkoxydisiloxane as a precursor to the film. More specifically, described herein is a composition and chemical vapor deposition (CVD) method for forming a dense film having a dielectric constant, k≥2.5, wherein the film has a high elastic modulus and excellent resistance to plasma induced damage as compared to films made from conventional precursors.

The electronics industry utilizes dielectric materials as insulating layers between circuits and components of integrated circuits (IC) and associated electronic devices. Line dimensions are being reduced in order to increase the speed and memory storage capability of microelectronic devices (e.g., computer chips). As the line dimensions decrease, the insulating requirements for the interlayer dielectric (ILD) become much more rigorous. Shrinking the spacing requires a lower dielectric constant to minimize the RC time constant, where R is the resistance of the conductive line and C is the capacitance of the insulating dielectric interlayer. Capacitance (C) is inversely proportional to spacing and proportional to the dielectric constant (k) of the interlayer dielectric (ILD). Conventional silica ($SiO_2$) CVD dielectric films produced from $SiH_4$ or TEOS ($Si(OCH_2CH_3)_4$, tetraethylorthosilicate) and $O_2$ have a dielectric constant k greater than 4.0. There are several ways in which industry has attempted to produce silica-based CVD films with lower dielectric constants, the most successful being the doping of the insulating silicon oxide film with organic groups providing dielectric constants ranging from about 2.5 to about 3.5. This organosilica glass is typically deposited as a dense film (density ~1.5 g/cm$^3$) from an organosilicon precursor, such as a methylsilane or siloxane, and an oxidant, such as $O_2$ or $N_2O$. Organosilica glass will be herein be referred to as OSG.

Patents, published applications, and publications in the field of porous ILD by CVD methods field include: EP 1 119 035 A2 and U.S. Pat. No. 6,171,945, which describe a process of depositing an OSG film from organosilicon precursors with labile groups in the presence of an oxidant such as $N_2O$ and optionally a peroxide, with subsequent removal of the labile group with a thermal anneal to provide porous OSG; U.S. Pat. Nos. 6,054,206 and 6,238,751, which teach the removal of essentially all organic groups from deposited OSG with an oxidizing anneal to obtain porous inorganic $SiO_2$; EP 1 037 275, which describes the deposition of an hydrogenated silicon carbide film which is transformed into porous inorganic $SiO_2$ by a subsequent treatment with an oxidizing plasma; and U.S. Pat. No. 6,312,793 B1, WO 00/24050, and a literature article Grill, A. Patel, *V. Appl. Phys. Lett.* (2001), 79(6), pp. 803-805, which all teach the co-deposition of a film from an organosilicon precursor and an organic compound, and subsequent thermal anneal to provide a multiphase OSG/organic film in which a portion of the polymerized organic component is retained. In the latter references, the ultimate final composition of the films indicate residual porogen and a high hydrocarbon film content of approximately 80 to 90 atomic %. Further, the final films retain the $SiO_2$-like network, with substitution of a portion of oxygen atoms for organic groups.

U.S. Pat. Appl. No. 2011/10113184 discloses a class of low k precursors that can be used to deposit insulating films with increased densities of —$SiCH_2Si$— groups and dielectric constants ranging from ~k=2.4 to k=2.8 via a PECVD process. In U.S. Pat. Appl. No. 2011/10113184 low k films are deposited using Si based precursors where at least one branched hydrocarbon group R (e.g., an isobutyl, isopentyl, neopentyl, or neohexyl group) is attached to the silicon atom of the low k precursor via a methylene group ($SiCH_2R$). The inventors claim that during the deposition process a high density of $SiCH_2Si$ groups forms within the film via plasma dissociation of the bond connecting the branched hydrocarbon group R to the methylene group in $SiCH_2R$. There are three significant limitations of this approach. The first limitation is that the incorporation of large branching alkyl groups in the precursor is expensive. The second limitation is that the incorporation of one or more large branching alkyl groups into the precursor generally results in precursors that have a very high boiling point due to the increased molecular weight from the large branching alkyl groups. The increased boiling point may negatively impact the manufacturing process by making it difficult to deliver the chemical precursor into the reaction chamber as a gas phase reagent without condensing it in the vapor delivery line or the process pump exhaust. The third limitation is that the high density of $SiCH_2Si$ groups in low k films reported in U.S. Pat. Appl. No. 2011/10113184 appear to form after the as deposited films are UV annealed. Thus, the formation of $SiCH_2Si$ groups in the low k films described in this patent application is likely due to UV curing (i.e., post treatment after the deposition process) rather than precursor selection. It is recognized that the increase in the density of $SiCH_2Si$ groups upon exposure of a low k film to ultraviolet irradiation is well documented. The fourth limitation is that most of the values of the dielectric constant reported in this approach are low, less than or equal to 2.8. It is well established that the lowest dielectric constant achievable for dense low k films with reasonable mechanical properties is approximately 2.7 to 2.8. Thus, the approach disclosed US Publication US201110113184A is not related to the deposition of dense low k films in the absence of post deposition processing (i.e., UV annealing), but is more akin to a tethered porogen approach for generating porous low k films.

US Patent appl No. US2020075321 A discloses a method of forming a low-k carbon-doped silicon oxide (CDO) layer having a high hardness by a plasma-enhanced chemical vapor deposition (PECVD) process. The method includes providing a carrier gas at a carrier gas flow rate and a CDO precursor at a precursor flow rate to a process chamber. A radio frequency (RF) power is applied at a power level and a frequency to the COO precursor. The CDO layer is deposited on a substrate within the process chamber.

Plasma or process induced damage (PID) in low k films is caused by the removal of carbon during plasma exposure, particularly during etch and photoresist strip processes (e.g., $NH_3$ based strip processes). Carbon depletion causes the plasma damaged region to change from hydrophobic to hydrophilic. Exposure of the hydrophilic plasma damaged region to dilute HF-based wet chemical post plasma treatments results in rapid dissolution of this damaged region and an increase in the k of the film (the hydrophobic damaged layer increases moisture update). In patterned low k films (created using etch and photoresist strip processes) exposure to a dilute HF-based post plasma treatment results in profile erosion. Profile erosion can result in the formation of re-entrant features (resulting in metallization defects) and reduced spacing between metal lines (resulting in increased capacitance). This is particularly problematic in advanced logic devices, where the depth of profile erosion can be a significant fraction of the logic ½ pitch. In general, the greater the carbon content of the low k film the lower the depth of PID. Process induced damage and the resulting profile erosion in low k films is a significant problem that device manufacturers must overcome when integrating low k materials in a ULSI interconnect, particularly for the lowest levels in the back end of the line. Thus, it is desirable to deposit low k films with the both the highest possible mechanical strength and the greatest resistance to PID. Unfortunately, these two factors often work in opposition to one another; while films with a higher carbon content exhibit a greater resistance to PID, the higher carbon content generally results in the incorporation of more terminal silicon methyl groups (Si-Me or $Si(CH_3)_x$) within the oxide network lowering the films mechanical strength (FIG. 1).

Low k films with better intrinsic electrical properties, such as a lower leakage current density and a higher electric field at breakdown, are preferred for manufacturing advanced integrated circuits; minimum intrinsic electrical requirements typically include a leakage current density of less than $1\times10^{-9}$ $A/cm^2$ at a field strength of 1 MV/cm and an electric breakdown field of 4 MV/cm or greater. Since the breakdown field in device structures decreases as dimensions are decreased (i.e., as devices scale in accordance with Moore's law), a low k material with the highest possible electric field at breakdown is preferred (>4 MV/cm). This is particularly important in the lowest levels of the BEOL where the small dimensions can result in high electrical field strengths. It has also been reported that low leakage current levels ensure good reliability in integrated circuits. Unfortunately, there are multiple challenges associated with depositing a low k film with an intrinsically low leakage current density. For example, the use of a single structure former precursor has been reported to result in high leakage current densities, presumably due to the formation of oxygen deficiency related defects. Further, low leakage current density also depends on post deposition treatments, such as UV annealing. To illustrate, it has been reported that as deposited low k films always have a higher leakage current density than the same film following UV annealing. This is a significant limitation as UV annealing increases equipment cost, process complexity, and reduces throughput. Thus, there is a need for as deposited low k films, deposited from a single structure former precursor, with better intrinsic electrical properties, specifically a low leakage current density (@ 1 MV/cm) and the highest possible breakdown field (≥4 MV/cm).

Thus, particularly for lowest levels in the back end of the line, there is a need for volatile structure former low k precursors that can be used to deposit dense low k films that have a strong resistance to plasma induced damage, high mechanical strength, and a high breakdown voltage (>5 MV/cm) at a given value of the dielectric constant (k≤3.5). Further, the films deposited from such precursors should not require post deposition treatment, such as UV curing, to improve the films mechanical properties or the films electrical properties. That is, the intrinsic properties of the as deposited film should meet the requirements for integrated circuit manufacturing such that post deposition steps (i.e., UV curing) are not needed.

BRIEF SUMMARY OF THE INVENTION

The method and composition described herein fulfill one or more needs described above. The method and composition described herein us an alkoxydisiloxane compound such as, for example, 1-iso-propoxy-1,1,3,3-tetramethyldisiloxane (IPOTMDS), as a structure former that can be used to deposit dense low k films with k valves between about 2.50 to about 3.30, such films exhibiting an unexpectedly high resistance to PID and equivalent or greater mechanical properties than films at the same value of the dielectric constant made from prior art structure former precursors such as diethoxymethylsilane (DEMS®), DEMS® being a prior art structure former designed to deposit films with high mechanical strength. Further, in certain embodiments, as measured by a Hg probe, films made from the alkoxydisiloxanes described herein have a higher electric field at breakdown than films at the same value of the dielectric constant made from prior art structure former precursors designed for high mechanical strength such as DEMS®. Further, the desired film properties are observed in as deposited films made from alkoxydisiloxane precursors without the need for post deposition treatment steps, such as UV curing.

Described herein is a dense dielectric film comprising a material represented by $Si_vO_wC_xH_y$, where v+w+x+y=100%, v is from 10 to 40 atomic %, w is from 10 to 65%, x is from 5 to 35 atomic %, and y is from 10 to 50 atomic % wherein the film has a dielectric constant less than 3.5. In certain embodiments, the carbon content of the film is comprised of a high fraction of $SiCH_2Si$ groups as measured by IR spectroscopy and exhibits a depth of carbon removal when exposed to, for example, an $O_2$ or $NH_3$ plasma as measured by examining the carbon content determined by SIMS depth profiling.

In one aspect, a method is provided for making a dense organosilica film, the method comprising the steps of: providing a substrate within a reaction chamber; introducing into the reaction chamber a gaseous composition comprising at least one alkoxydisiloxane compound having the structure of Formula (I):

I

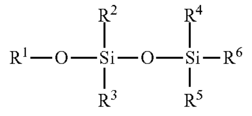

where $R^1$ is selected from a linear or branched $C_1$ to $C_6$ alkyl, preferably methyl, ethyl, propyl, iso-propyl, butyl, sec-butyl, or tert-butyl, and a cyclic $C_5$ to $C_6$ alkyl; $R^2$ is selected from hydrogen, and a linear or branched $C_1$ to $C_5$ alkyl; $R^{3-5}$ are selected independently from a linear or branched $C_1$ to $C_5$ alkyl, preferably methyl; and $R^6$ is selected from hydrogen, a linear or branched $C_1$ to $C_5$ alkyl, or $OR^7$ wherein $R^7$ is selected from a linear or branched $C_1$ to $C_5$ alkyl; applying energy to the gaseous composition comprising the alkoxydisiloxane in the reaction chamber to induce reaction of the gaseous composition comprising the alkoxydisiloxane to deposit an organosilica film on the substrate. According to an exemplary embodiment the organosilica film has a dielectric constant of from ~2.50 to ~3.30 and an elastic modulus of from ~6 to ~35 GPa. For the above Formula (I), combinations of alkyl groups are selected such that a molecule's boiling point is less than 200° C. In addition, for optimum performance the alkyl groups may be chosen so that the molecule forms secondary or tertiary radicals upon homolytic bond dissociation (e.g., SiO—$R^1$→Si·+$R^1$·, wherein $R^1$· is a secondary or tertiary radical such as an isopropyl radical or a tert-butyl radical).

DETAILED DESCRIPTION OF THE INVENTION

Figure 1:
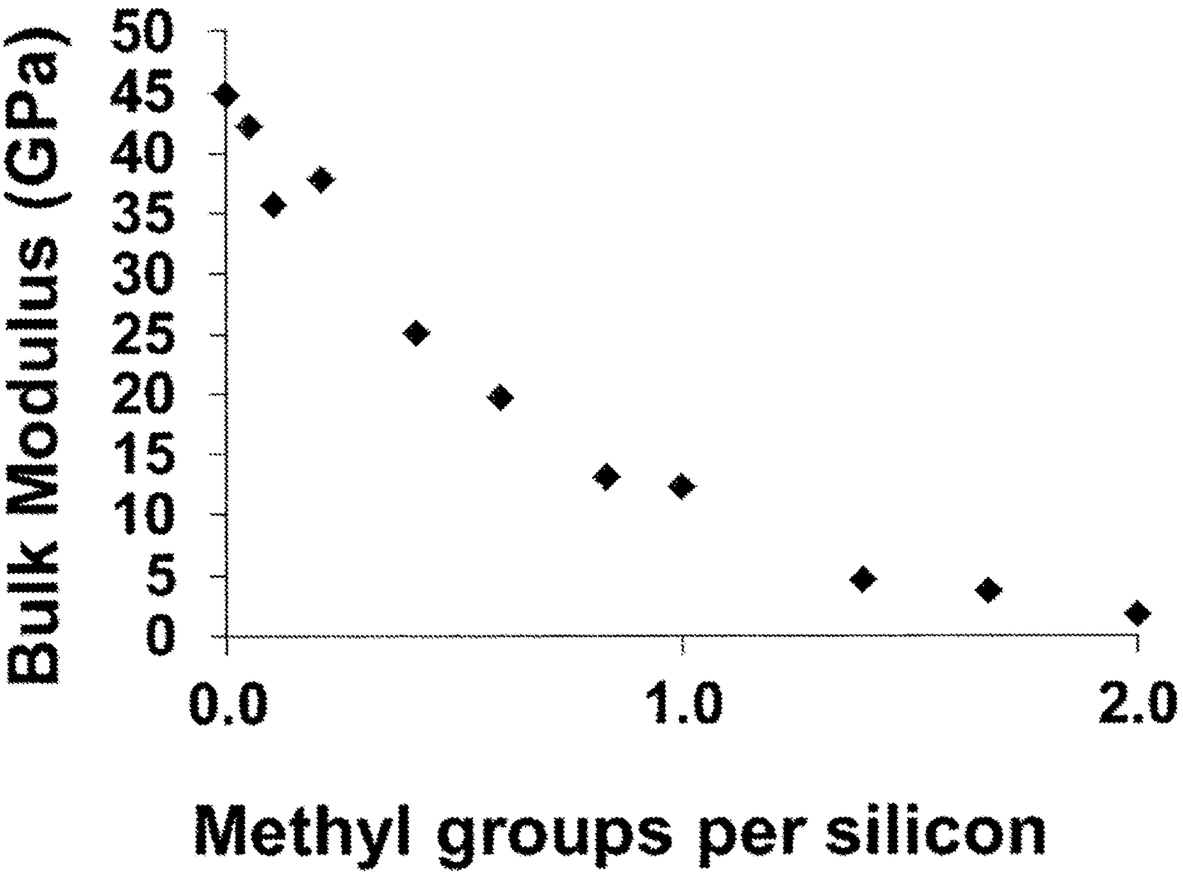
FIG. 1 illustrates the predicted relationship between mechanical strength (bulk modulus GPa) and the Methyl (Me)/Si ratio in low k dielectric films obtained from computer modeling.

Described herein is a chemical vapor deposition (CVD) method for making a dense organosilica film, the method comprising the steps of: providing a substrate within a reaction chamber; introducing into the reaction chamber a gaseous composition comprising an alkoxydisiloxane such as, for example, 1-iso-propoxy-1,1,3,3-tetramethyldisiloxane (IPOTMDS) or 1-ethoxy-1,1,3,3-tetramethydisiloxane (EOTMDS) and a gaseous oxidant such as $O_2$ or $N_2O$, and an inert gas such as He; and applying energy to the gaseous composition comprising the alkoxydisiloxane in the reaction chamber to induce reaction of the gaseous composition comprising the alkoxydisiloxane to deposit an organosilica film on the substrate, wherein the organosilica film has a dielectric constant of from ~2.50 to ~3.50. According to an exemplary embodiment the organosilica film has a dielectric constant of from ~2.70 to ~3.30, an elastic modulus of from ~6 to ~35 GPa, and an at. % carbon of from ~15 to ~40 as measured by XPS, preferably a dielectric constant of from ~2.80 to ~3.20, an elastic modulus of from ~7 to ~27 GPa, and an at. % carbon from ~15 to ~40 as measured by XPS. It is recognized that organosilica films with the desired film properties can also be deposited using a gaseous composition that does not include an oxidant.

The alkoxydisiloxane compounds described herein provide unique attributes that make it possible to deposit a dense as deposited OSG film with a relatively low total carbon content (typically less than 25 atomic percent by XPS) yet exhibit an exceptionally high resistance to carbon removal when exposed to an $NH_3$ or $O_2$ plasma. It is well established that the resistance to carbon removal from a dielectric film increases as the total carbon content of the film increases. That is, a film with a high total carbon content will exhibit a smaller depth of carbon removal when exposed to an $NH_3$ or $O_2$ plasma than a film with a lower total carbon content. This is illustrated in U.S. Pat. No. 9,922,818 where the depth of carbon removal for a low k film containing 36% carbon (XPS, atomic %) is 20% less (35 nm compared to 44 nm) than a low k film containing 23% carbon (XPS, atomic %). Thus, it is unexpected that a dielectric film made using an alkoxydisiloxane structure former precursor containing a relatively low total carbon content (<~25%, as measured by XPS) can exhibit the same or smaller depth of carbon removal when exposed to an $NH_3$ or $O_2$ plasma as a dielectric film made using a precursor designed to deposit films with a high total carbon content (>~25%, as measured by XPS). As disclosed in U.S. Pat. No. 9,922,818 precursors such as 1-methyl-1-iso-propoxy-1-silacyclopentane (MIPSCP) can be used to make films with a high total carbon content (>~25%) and an exceptional resistance to carbon removal when exposed to an $NH_3$ or $O_2$ plasma.

The unique attributes of alkoxydisiloxane compounds in Formula (I) also make it possible to achieve a relatively low dielectric constant for a dense OSG film and for such films to surprisingly exhibit mechanical properties equivalent to or greater than films deposited from prior art structure former precursors designed for depositing films with high mechanical strength such as DEMS®.

For example, DEMS®, a prior art structure former designed for deposited films with high mechanical strength, provides a mixed ligand system with two alkoxy groups, one methyl, and one hydride which offers a balance of reactive sites and allows for the formation of more mechanically robust films while retaining the desired dielectric constant. In films deposited using DEMS® as the structure forming precursor where the carbon exists mainly in the form of terminal Si-Me groups there is a relationship between the % Si-Me (directly related to % C) vs mechanical strength, see for example the modeling work shown in FIG. 1, where the replacement of a bridging Si—O—Si group with two terminal Si-Me groups decreases the mechanical properties because the network structure is disrupted. Unexpectedly, dense as deposited OSG films made from alkoxydisiloxane compounds in Formula (I) have a higher Si-Me concentration than films made from DEMS® and exhibit mechanical properties equivalent to or greater than films made from DEMS®. Thus, it is unexpected that films with a higher the concentration of Si-Me groups made from alkoxydisiloxane compounds in Formula (I) would have mechanical properties equivalent to or greater than films with a lower concentration of Si-Me groups made from prior art structure former precursors designed for high mechanical strength such as DEMS®.

The alkoxydisiloxane compounds described herein provide unique attributes that make it possible for one to incorporate a different distribution of the type of carbon in the dielectric film compared to prior art structure former precursors such as diethoxymethylsilane (DEMS®) and MIPSCP. For example, in dense OSG films deposited using DEMS® as the structure former the carbon in the film exists mainly in the form of terminal Si-Me groups ($Si(CH_3)$); a small density of disilylmethene groups ($SiCH_2Si$) may also be present in the film. The alkoxydisiloxane precursors described herein such as, for example 1-iso-propoxy-1,1,3,3-tetramethyldisiloxane (IPOTMDS), can be used to deposit dense OSG films with a greater total carbon content than DEMS® based films at a given value of the dielectric constant. However, the distribution of carbon in films made using alkoxydisiloxane precursors is very different than that in films made using DEMS®. Films made using alkoxydisiloxane precursors have a higher concentration of terminal Si-Me groups ($Si(CH_3)$) and a much higher concentration of bridging $SiCH_2Si$ groups than films made using prior art structure formers such as DEMS®. That is, in films made using the inventive alkoxydisiloxane precursors a much greater percentage of the total carbon in the film is incorporated as bridging $SiCH_2Si$ groups compared to prior art structure former precursors such as DEMS®.

Whereas prior art silicon-containing structure-forming precursors, for example DEMS®, polymerize, once energized in the reaction chamber to form a structure having an —O— linkage (e.g., —Si—O—Si or —Si—O—C—) in the polymer backbone, alkoxydisiloxane compounds such as, for example, the IPOTMDS molecule polymerizes in such a way to form a structure where, some of the —O— bridge in the backbone is replace with a —$CH_2$— methylene bridge. In films deposited using DEMS® as the structure forming precursor where the carbon exists mainly in the form of terminal Si-Me groups there is a relationship between the % Si-Me versus mechanical strength, see for example the predicted relationship between elastic modulus and the methyl groups per silicon atom in FIG. 1, where the replacement of a bridging Si—O—Si group with two terminal Si-Me groups decreases the mechanical properties because the network structure is disrupted. Not to be bound by theory, in the case of alkoxydisiloxane compounds it is believed that the precursor structure facilitates reactions in the plasma that convert a high percentage of the terminal Si-Me groups ($Si(CH_3)$) in the structure former into bridging methylene groups (disilylmethylene, $SiCH_2Si$) in the network structure of the film. In this manner, one can incorporate carbon in the form of a bridging group so that, from a mechanical strength view, the network structure is not disrupted by increasing the carbon content in the film. This also adds carbon to the film, allowing the film to be more resilient to carbon depletion from processes such as etching of the film, plasma ashing of photoresist, and $NH_3$ plasma treatment of copper surfaces. Another unique attribute of films made using alkoxydisiloxane compounds of Formula (I) such as, for example IPOTMDS, is that the percentage of the total carbon content comprised of $SiCH_2Si$ groups is high compared to prior art structure formers such as DEMS® and MIPSCP.

Other prior art structure former precursors, such as 1-methyl-1-iso-propoxy-1-silacyclopentane (MIPSCP) can deposit dense OSG films with a high concentration of disilylmethylene groups ($SiCH_2Si$). However, dense OSG films deposited from MIPSCP that contain a high concentration of disilylmethylene groups ($SiCH_2Si$) also have a high total carbon content, resulting in a smaller percentage of the total carbon being incorporated as disilylmethylene groups compared to dense OSG films deposited from alkoxydisiloxane precursors described herein, such as 1-iso-propoxy-1,1,3,3-tetramethyldisiloxane (IPOTMDS). Further, dense OSG films deposited from MIPSCP also contain a high concentration of terminal Si-Me groups ($Si(CH_3)_x$). As shown in FIG. 1, the high concentration of terminal Si-Me groups negatively impacts the films mechanical strength, ultimately limiting the highest mechanical strength achievable using MIPSCP as the structure former.

The alkoxydisiloxane provides unique attributes that make it possible to achieve a relatively low dielectric constant for a dense organosilica film and to exhibit equivalent or greater mechanical properties compared to prior art structure former precursors such as diethoxymethylsilane (DEMS®) and 1-iso-propoxy-1-methylsilacyclopentane (MIPSCP). Not bound by theory, it is believed alkoxydisiloxanes according to the present invention can provide more stable radicals than methyl radicals as disclosed in prior art such as $Me_3SiOMe$ or $Me_3SiOEt$ (Bayer, C., et al. "Overall Kinetics of $SiO_x$ Remote-PECVD using Different Organosilicon Monomers," 116-119 Surf. Coat. Technol. 874 (1999)) such as $(CH_3)_2CH\cdot$, $(CH_3)(CH_3CH_2)HC\cdot$, $(CH_3)_3C\cdot$, sec-pentyl, tert-pentyl, cyclopentyl, and cyclohexyl (depending upon the alkoxy group in the alkoxydisiloxane), during plasma enhanced chemical vapor deposition when $R^1$ is selected from the group consisting of a branched or cyclic $C_3$ to $C_{10}$ alkyl, such as iso-propyl, sec-butyl, tert-butyl, sec-pentyl, tert-pentyl, cyclopentyl, or cyclohexyl. The higher density of more stable radicals such as $(CH_3)_2CH\cdot$, $(CH_3)(CH_3CH_2)HC\cdot$, $(CH_3)_3C\cdot$, sec-pentyl, tert-pentyl, cyclopentyl, and cyclohexyl in the plasma may increase the probability of abstraction of a hydrogen atom from one of the terminal silicon methyl groups (Si—$(CH_3)_2$) in the precursor (forming $SiCH_2\cdot$) and facilitate the formation of bridging Si—$CH_2$—Si groups in the as deposited film. Presumably in the case of IPOTMDS the presence of four terminal silicon methyl groups in the precursor (two per silicon atom) favor the formation of high densities of disilylmethylene groups (Si—$CH_2$—Si) in the as deposited film relative to precursors containing fewer terminal methyl groups per silicon atom. Presumably in the case of IPOTMDS the presence of the Si—H bond facilitates ready access to two of the terminal methyl groups per silicon in the precursor and favors the formation of high densities of disilylmethylene groups (Si—$CH_2$—Si) in the as deposited film relative to precursors that contain ligands larger than a H atom. Films with the favorable properties disclosed in this application can also be deposited from alkoxydisiloxanes of Formula (I), where $R^1$=Me or Et.

Some of advantages over prior achieved with alkoxydisiloxanes as silicon precursors include but not limited to:

- Lower cost and easy to synthesize
- High resistance to PID
- High elastic modulus
- High percentage of the total carbon content comprised of $SiCH_2Si$
- High initial breakdown voltage ($E_{BD}$)

In one aspect, a method is provided for making a dense organosilica film with improved resistance to PID and high mechanical properties, the method comprising the steps of: providing a substrate within a reaction chamber; introducing into the reaction chamber a gaseous composition comprising at least one alkoxydisiloxane compound having the structure of Formula (I):

I

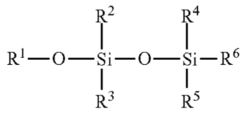

wherein $R^1$ is selected from a linear or branched $C_1$ to $C_6$ alkyl, preferably methyl, ethyl, n-propyl, iso-propyl, n-butyl, iso-butyl, sec-butyl, or tert-butyl, and a cyclic $C_5$ to $C_6$ alkyl; $R^2$ is selected from hydrogen, and a linear or branched $C_1$ to $C_5$ alkyl, preferably methyl; $R^{3-5}$ are selected independently from a linear or branched $C_1$ to $C_5$ alkyl, preferably methyl; and $R^6$ is selected from hydrogen, a linear or branched $C_1$ to $C_5$ alkyl or $OR^7$ wherein $R^7$ is selected from a linear or branched $C_1$ to $C_5$ alkyl; with or without an oxygen source. For the above Formula (I) combinations of alkyl groups are selected such that the molecule's boiling point is less than 200° C. In addition, for optimum performance the alkyl groups are chosen that form secondary or tertiary radicals upon homolytic bond dissociation (e.g., $SiO—R^1 \rightarrow SiO \cdot + R^1 \cdot$, wherein $R^1 \cdot$ is a secondary or tertiary radical such as an isopropyl radical or a tert-butyl radical that is formed when energy is applied to the gaseous composition in the reaction chamber). Energy is then applied to the gaseous composition comprising the alkoxydisiloxane in the reaction chamber to induce reaction of the gaseous composition comprising the alkoxydisiloxane to deposit an organosilicon film on the substrate. According to an exemplary embodiment the organosilica film has a dielectric constant of from ~2.70 to ~3.20 and an elastic modulus of from ~7 to ~27 GPa. The substrate temperature may also have an impact on the properties of the resulting dense orgaosilica films, for example higher temperatures such as 300 to 400, or 350 to 400° C., may be preferred. In certain embodiments, the oxygen source is selected from the group consisting of water vapor, water plasma, ozone, oxygen, oxygen plasma, oxygen/helium plasma, oxygen/argon plasma, nitrogen oxides plasma, carbon dioxide plasma, hydrogen peroxide, organic peroxides, and mixtures thereof.

In one particular embodiment, a method is provided for making a dense organosilica film with improved resistance to PID and high mechanical properties, the method comprising the steps of: providing a substrate within a reaction chamber; introducing into the reaction chamber a gaseous composition comprising at least one alkoxydisiloxane compound having the structure of given in Formula (II):

II

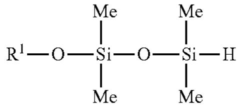

wherein $R^1$ is selected from a linear or branched $C_1$ to $C_6$ alkyl, preferably methyl, ethyl, n-propyl, iso-propyl, n-butyl, iso-butyl, sec-butyl, or tert-butyl, preferably ethyl, iso-propyl or sec-butyl, or tert-butyl, and a cyclic $C_5$ to $C_6$ alkyl; with or without an oxygen source; with or without an inert gas such as He. Energy is then applied to the gaseous composition comprising the alkoxydisiloxane in the reaction chamber to induce reaction of the gaseous composition comprising the alkoxydisiloxane to deposit an organosilicon film on the substrate. According to an exemplary embodiment the organosilica film has a dielectric constant of from ~2.70 to ~3.20 and a higher elastic modulus of from ~7 to ~27 GPa due to $Si—CH_2—Si$ linkages.

Table I lists preferred alkoxydisiloxanes having Formula (II). Although there are numerous compounds disclosed, the most preferred molecules are those with a combination of alkyl groups ($R^{1-6}$) selected such that the molecules' boiling points are less than 200° C. (preferably less than 150° C.).

In addition, for optimum performance $R^{1-6}$ are chosen that form secondary or tertiary radicals upon homolytic bond dissociation (e.g., $Si—R^{2-5} \rightarrow Si \cdot + R^{2-5}$ or $SiO—R^1 \rightarrow SiO \cdot + R^1 \cdot$, wherein $R^2 \cdot$ and $R^1 \cdot$ are a secondary or tertiary radical such as the isopropyl radical or the tert-butyl radical). A most preferred example of an akoxydisiloxane is 1-ethoxy-1,1,3,3-tetramethyldisiloxane, 1-iso-propoxy-1,1,3,3-tetramethyldisiloxane (IPOTMDS) or 1-sec-butoxy-1,1,3,3-tetramethyldisiloxane (SBOTMDS), with a predicted boiling point from 110° C. and 180° C. at 760 Torr, respectively.

List of preferred alkoxydisiloxane compounds having Formula (II)

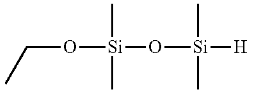

1-ethoxy-1,1,3,3-tetramethyldisiloxane

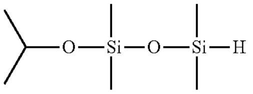

1-iso-propoxy-1,1,3,3-tetramethyldisiloxane

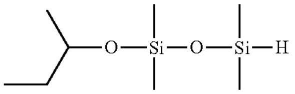

1-sec-butoxy-1,1,3,3-tetramethyldisiloxane

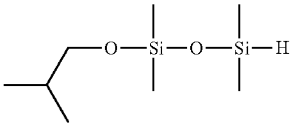

1-iso-butoxy-1,1,3,3-tetramethyldisiloxane

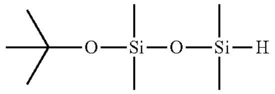

1-tert-butoxy-1,1,3,3-tetramethyldisiloxane

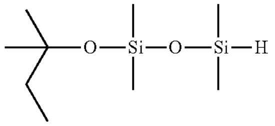

1-tert-pentoxy-1,1,3,3-tetramethyldisiloxane

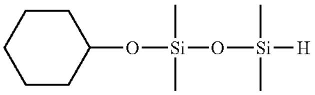

1-cyclohexoxy-1,1,3,3-tetramethyldisiloxane

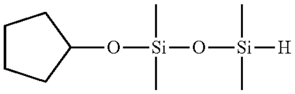

1-cyclopentoxy-1,1,3,3-tetramethyldisiloxane

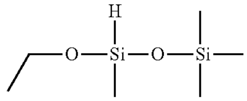

1-ethoxy-1,3,3,3,-tetramethyldisiloxane

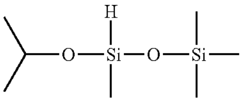

1-iso-propoxy-1,3,3,3-tetramethyldisiloxane

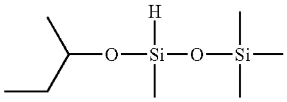

1-sec-butoxy-1,3,3,3-tetramethyldisiloxane

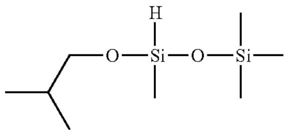

1-iso-butoxy-1,3,3,3-tetramethyldisiloxane

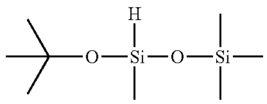

1-tert-butoxy-1,3,3,3-tetramethyldisiloxane

-continued

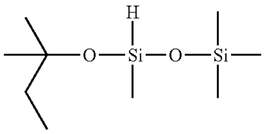

1-tert-pentoxy-1,3,3,3-tetramethyldisiloxane

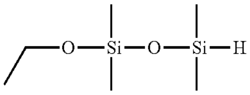

1-methoxy-1,1,3,3-tetramethyldisiloxane

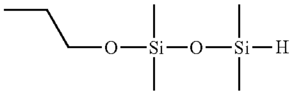

1-propoxy-1,1,3,3-tetramethyldisiloxane

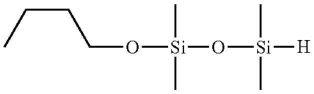

1-butoxy-1,1,3,3-tetramethyldisiloxane

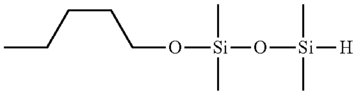

1-pentoxy-1,1,3,3-tetramethyldisiloxane

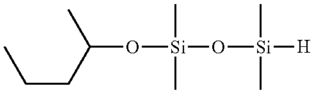

1-(1′-methylbutoxy)-1,1,3,3-tetramethyldisiloxane

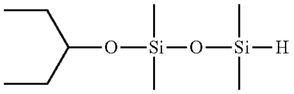

1-(1′-ethylpropoxy)-1,1,3,3-tetramethyldisiloxane

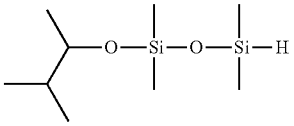

1-(1′,2′-dimethylpropoxy)-1,1,3,3-tetramethyldisiloxane

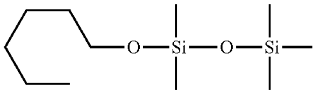

1-hexoxy-1,1,3,3-tetramethyldisiloxane

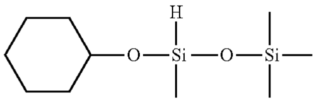

1-cyclohexoxy-1,3,3,3-tetramethyldisiloxane

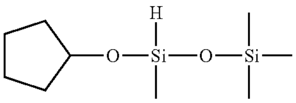

1-cyclopentoxy-1,3,3,3-tetramethyldisiloxane

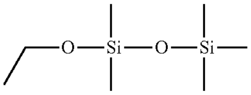

1-ethoxy-1,1,3,3,3-pentamethyldisiloxane

-continued

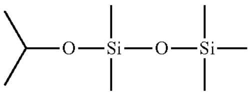

1-iso-propoxy-1,1,3,3,3-pentamethyldisiloxane

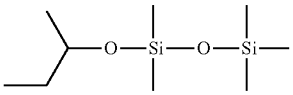

1-sec-butoxy-1,1,3,3,3-pentamethyldisiloxane

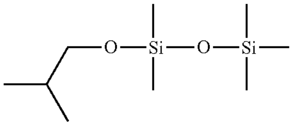

1-iso-butoxy-1,1,3,3,3-pentamethyldisiloxane

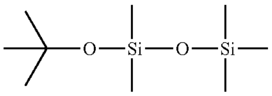

1-tert-butoxy-1,1,3,3,3-pentamethyldisiloxane

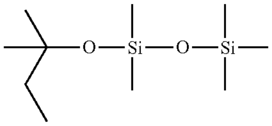

1-tert-pentoxy-1,1,3,3,3-pentamethyldisiloxane

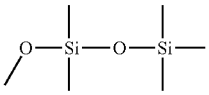

1-methoxy-1,1,3,3,3-pentamethyldisiloxane

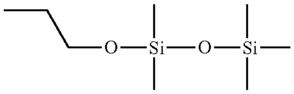

1-propoxy-1,1,3,3,3-pentamethyldisiloxane

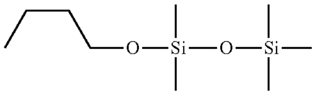

1-butoxy-1,1,3,3,3-pentamethyldisiloxane

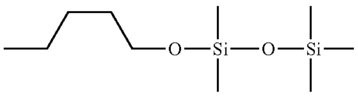

1-pentoxy-1,1,3,3,3-pentamethyldisiloxane

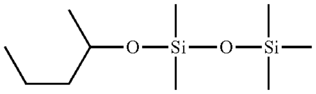

1-(1′-methylbutoxy)-1,1,3,3,3-pentamethyldisiloxane

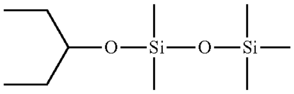

1-(1′-ethylpropoxy)-1,1,3,3,3-pentamethyldisiloxane

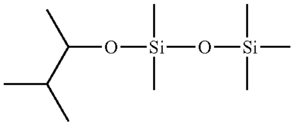

1-(1′,2′-dimethylpropoxy)-1,1,3,3,3-pentamethyldisiloxane

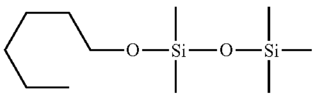

1-hexoxy-1,1,3,3,3-pentamethyldisiloxane

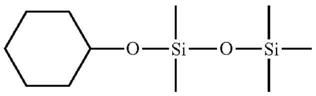

1-cyclohexoxy-1,1,3,3,3-pentamethyldisiloxane

-continued

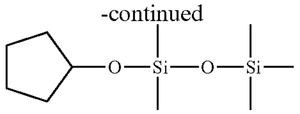

1-cyclopentoxy-1,1,3,3,3-pentamethyldisiloxane

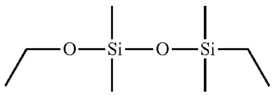

1,3-diethoxy-1,1,3,3-tetramethyldisiloxane

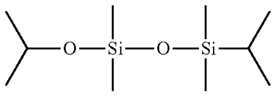

1,3-di-iso-propoxy-1,1,3,3-tetramethyldisiloxane

The alkoxydisiloxanes having Formula (I) or (II) according to the present invention and compositions comprising the alkoxydisiloxanes compounds having Formula (I) or (II) according to the present invention are preferably substantially free of halide ions. As used herein, the term "substantially free" as it relates to halide ions (or halides) such as, for example, chlorides (i.e. chloride-containing species such as HCl or silicon compounds having at least one Si—Cl bond) and fluorides, bromides, and iodides, means less than 5 ppm (by weight) measured by on chromatography (IC), preferably less than 3 ppm measured by IC, and more preferably less than 1 ppm measured by IC, and most preferably 0 ppm measured by IC. Chlorides are known to act as decomposition catalysts for the silicon precursor compounds having Formula (I) or (II). Significant levels of chloride in the final product can cause the silicon precursor compounds to degrade. The gradual degradation of the silicon precursor compounds may directly impact the film deposition process making it difficult for the semiconductor manufacturer to meet film specifications. In addition, the shelf-life or stability is negatively impacted by the higher degradation rate of the silicon precursor compounds thereby making it difficult to guarantee a 1-2 year shelf-life.

The alkoxydisiloxanes having Formula (I) or (II) are preferably substantially free of metal ions such as, $Li^+$, $Na^+$, $K^+$, $Mg^{2+}$, $Ca^{2+}$, $Al^{3+}$, $Fe^{2+}$, $Fe^{3+}$, $Ni^{2+}$, $Cr^{3+}$. As used herein, the term "substantially free" as it relates to Li, Na, K, Mg, Ca, Al, Fe, Ni, Cr means less than 5 ppm (by weight), preferably less than 3 ppm, and more preferably less than 1 ppm, and most preferably 0.1 ppm as measured by ICP-MS. In some embodiments, the silicon precursor compounds having Formula (I) are free of metal ions such as, $Li^+$, $Na^+$, $K^+$, $Mg^{2+}$, $Ca^{2+}$, $Al^{3+}$, $Fe^{2+}$, $Fe^{3+}$, $Ni^{2+}$, $Cr^{3+}$. As used herein, the term "free of" metal impurities as it relates to Li, Na, K, Mg, Ca, Al, Fe, Ni, Cr, means less than 1 ppm, preferably 0.1 ppm (by weight) as measured by ICP-MS, most preferably 0.05 ppm (by weight) as measured by ICP-MS or other analytical method for measuring metals. In addition, the alkoxydisiloxanes having Formula (I) preferably to have a purity of 98 wt. % or higher, more preferably 99 wt. % or higher as measured by GC when used as precursor to deposit dense orgaosilica films.

Importantly the alkoxydisiloxane compounds having Formula (I) are preferably substantially free of oxygen-containing or nitrogen-containing impurities such as those originating from either starting materials employed during synthesis or by-products generated during synthesis. Examples include but not limited to, tetramethyldisiloxane, organic amines such as triethylamine, pyridine and any other organic amines used to promote the reaction. As used herein, the term "free of" oxygen-containing or nitrogen-containing impurities as it relates to tetramethyldisiloxane, tetramethyldisilazane, organic amines such as triethylamine, pyridine and any other organic amines, means 10000 ppm or less, preferably 500 ppm or less (by weight) as measured by GC, most preferably 100 ppm or less (by weight) as measured by GC or other analytical method for assay. The oxygen-containing impurities as defined herein are compounds having at least one oxygen atom and are either from staring materials or generated from the synthesis of alkoxydisiloxanes compounds having Formula (I). Those oxygen-containing impurities may have close boiling points to the alkoxydisiloxanes compounds having Formula (I), thus remaining in the product after purification. Likewise, the nitrogen-containing impurities as defined herein are compounds having at least one nitrogen atom and are either from staring materials or generated from the synthesis of alkoxydisiloxanes compounds having Formula (I). Those nitrogen-containing impurities may have close boiling point to the alkoxydisiloxanes compounds having Formula (I), thus remaining in the product after purification.

The low k dielectric films are organosilica glass ("OSG") films or materials. Organosilicates are employed in the electronics industry, for example, as low k materials. Material properties depend upon the chemical composition and structure of the film. Since the type of organosilicon precursor has a strong effect upon the film structure and composition, it is beneficial to use precursors that provide the required film properties to ensure that the addition of the needed amount of porosity to reach the desired dielectric constant does not produce films that are mechanically unsound. The method and composition described herein provides the means to generate low k dielectric films that have a desirable balance of electrical and mechanical properties as well as other beneficial film properties as high carbon content to provide improved integration plasma resistance.

In certain embodiments of the method and composition described herein, a layer of silicon-containing dielectric material is deposited on at a least a portion of a substrate via a chemical vapor deposition (CVD) process employing a reaction chamber. The method thus includes the step of providing a substrate within a reaction chamber. Suitable substrates include, but are not limited to, semiconductor materials such as gallium arsenide ("GaAs"), silicon, and compositions containing silicon such as crystalline silicon, polysilicon, amorphous silicon, epitaxial silicon, silicon dioxide ("$SiO_2$"), silicon glass, silicon nitride, fused silica, glass, quartz, borosilicate glass, and combinations thereof. Other suitable materials include chromium, molybdenum, and other metals commonly employed in semiconductor, integrated circuits, flat panel display, and flexible display applications. The substrate may have additional layers such as, for example, silicon, $SiO_2$, organosilicate glass (OSG), fluorinated silicate glass (FSG), boron carbonitride, silicon carbide, hydrogenated silicon carbide, silicon nitride, hydrogenated silicon nitride, silicon carbonitride, hydrogenated silicon carbonitride, boronitride, organic-inorganic composite materials, photoresists, organic polymers, porous organic and inorganic materials and composites, metal oxides such as aluminum oxide, and germanium oxide. Still further layers can also be germanosilicates, aluminosilicates, copper and aluminum, and diffusion barrier materials such as, but not limited to, TiN, Ti(C)N, TaN, Ta(C)N, Ta, W, or WN.

The reaction chamber is typically, for example, a thermal CVD or a plasma enhanced CVD reactor or a batch furnace type reactor in a variety of ways. In one embodiment, a liquid delivery system may be utilized. In liquid delivery formulations, the precursors described herein may be delivered in neat liquid form, or alternatively, may be employed in solvent formulations or compositions comprising same. Thus, in certain embodiments the precursor formulations may include solvent component(s) of suitable character as may be desirable and advantageous in a given end use application to form a film on a substrate.

The method disclosed herein includes the step of introducing into the reaction chamber a gaseous composition comprising an alkoxydisiloxane. In some embodiments, the composition may include additional reactants such as, for example, oxygen-containing species such as, for example, $O_2$, $O_3$, and $N_2O$, gaseous or liquid organic substances, $CO_2$, or CO. In one particular embodiment, the reaction mixture introduced into the reaction chamber comprises the at least one oxidant selected from the group consisting of $O_2$, $N_2O$, NO, $NO_2$, $CO_2$, water, $H_2O_2$, ozone, and combinations thereof. In an alternative embodiment, the reaction mixture does not comprise an oxidant.

The composition for depositing the dielectric film described herein comprises from about 40 to about 100 weight percent of alkoxydisiloxane.

In embodiments, the gaseous composition comprising the alkoxydisiloxane can be used with hardening additives to further increase the elastic modulus of the as deposited films.

In embodiments, the gaseous composition comprising the alkoxydisiloxane is substantially free of or free of halides such as, for example, chlorides.

In addition to the alkoxydisiloxane, additional materials can be introduced into the reaction chamber prior to, during and/or after the deposition reaction. Such materials include, e.g., inert gas (e.g., He, Ar, $N_2$, Kr, Xe, etc., which may be employed as a carrier gas for lesser volatile precursors and/or which can promote the curing of the as-deposited materials and provide improved film properties).

Any reagent employed, including the alkoxydisiloxane can be carried into the reactor separately from distinct sources or as a mixture. The reagents can be delivered to the reactor system by any number of means, preferably using a pressurizable stainless steel vessel fitted with the proper valves and fittings to allow the delivery of liquid to the process reactor. Preferably, the precursor is delivered into the process vacuum chamber as a gas, that is, the liquid must be vaporized before it is delivered into the process chamber.

In other embodiments, the method disclosed herein includes the step of introducing into the reaction chamber a gaseous composition comprising a mixture of a 1-alkoxy-1-methylsilacyclopentane and alkoxydisiloxane.

The method disclosed herein includes the step of applying energy to the gaseous composition comprising the alkoxydisiloxane in the reaction chamber to induce reaction of the gaseous composition comprising the alkoxydisiloxane to deposit an organosilica film on the substrate, wherein the organosilica film has a dielectric constant of from ~2.50 to ~3.30 in some embodiments, 2.80 to 3.20 in other embodiments, and 2.80 to 3.10 in still preferred embodiments; an elastic modulus of from ~6 to ~35 GPa, preferably from 7 to 27 GPa; and an at. % carbon of from ~15 to ~40 as measured by XPS. Energy is applied to the gaseous reagents to induce the alkoxydisiloxane and other reactants, if present, to react and to form the film on the substrate. Such energy can be provided by, e.g., plasma, pulsed plasma, helicon plasma, high density plasma, inductively coupled plasma, remote plasma, hot filament, and thermal (i.e., non-filament) and methods. A secondary rf frequency source can be used to modify the plasma characteristics at the substrate surface. The secondary RF frequency can be applied with the primary RF frequency or following application of the secondary RF frequency. Preferably, the film is formed by plasma-enhanced chemical vapor deposition ("PECVD").

The flow rate for each of the gaseous reagents preferably ranges from 10 to 7000 sccm, more preferably from 30 to 3000 sccm, per single 300 mm wafer. The actual flow rates needed may depend upon wafer size and chamber configuration, and are in no way limited to 300 mm wafers or single wafer chambers.

In certain embodiments, the film is deposited at a deposition rate of from about ~5 to ~400 nanometers (nm) per minute. In other embodiments, the film is deposited at a deposition rate of from about 30 to 200 nanometers (nm) per minute.

The pressure in the reaction chamber during deposition typically ranges from about to about 600 torr or from about 1 to 15 torr.

The film is preferably deposited to a thickness of 0.001 to 500 microns, although the thickness can be varied as required. The blanket film deposited on a non-patterned surface has excellent uniformity, with a variation in thickness of less than 3% over 1 standard deviation across the substrate with a reasonable edge exclusion, wherein e.g., a 5 mm outermost edge of the substrate is not included in the statistical calculation of uniformity.

In addition to the inventive OSG products, the present invention includes the process by which the products are made, methods of using the products and compounds and compositions useful for preparing the products. For example, a process for making an integrated circuit on a semiconductor device is disclosed in U.S. Pat. No. 6,583,049, which is herein incorporated by reference.

The dense organosilica films produced by the disclosed methods exhibit excellent resistance to plasma induced damage, particularly during etch and photoresist strip processes.

The dense organosilica films produced by the disclosed methods exhibit excellent mechanical properties for a given dielectric constant relative to dense organosilica films having the same dielectric constant but made from a precursor that is not an alkoxydisiloxane. The resulting organosilica film (as deposited) typically has a dielectric constant of from ~2.50 to ~3.30 in some embodiments, ~2.80 to ~3.20 in other embodiments, and ~2.80 to ~3.10 in still other embodiments, an elastic modulus of from ~6 to ~35 GPa, and an at. % carbon of from ~15 to ~40 as measured by XPS. In other embodiments, the resulting organosilica film has a dielectric constant of from ~2.50 to 3.30 in some embodiments, ~2.80 to ~3.20 in other embodiments, and ~2.80 to ~3.10 in still other embodiments, an elastic modulus of from ~6 to ~35 GPa, in other embodiments, the resulting organosilica film has an elastic modulus of from ~7 to ~27 GPa in some embodiments, and ~7 to ~23 GPa in other embodiments, and an at. % carbon of from ~15 to ~40 as measured by XPS. In some embodiments, as it is believed that incorporation of nitrogen could potentially increase the dielectric of the dense organosilica films and negatively impact the electrical properties of the dense organosilica film, thus it is expected that the nitrogen content is 0.1 at. % or less, preferably 0.1 at. % or less, most preferably 0.01 at. % or less as measured by XPS, SIMS or RBS or any analytical methods. In addition, the organosilica film has a relative disilylmethylene density from ~1 to ~45, or ~5 to ~40, or ~10 to ~40 as calculated from the FTIR spectra. In some embodiments, the organosilica film is deposited at a rate of from ~5 nm/min to ~200 nm/min, or ~5 nm/min to ~100 nm/min. In other embodiments, the organosilica film is deposited with a higher rate of from ~100 nm/min to ~500 nm/min, or ~100 nm/min to ~350 nm/min, or ~200 nm/min to ~350 nm/min. Importantly it is expected the alkoxydisiloxanes having Formula (I) would provide a higher deposition rate than other alkoxysilanes as they have the pre-existing Si—O—Si linkage.

Throughout the description, the symbol "~" or "about" refers about 5.0% deviation from the value, for example ~3.00 denotes about 3.00 (±0.15)

The resultant dense organosilica films may also be subjected to a post treating process once deposited. Thus, the term "post-treating" as used herein denotes treating the film with energy (e.g., thermal, plasma, photon, electron, microwave, etc.) or chemicals to further enhance materials properties.

The conditions under which post-treating are conducted can vary greatly. For example, post-treating can be conducted under high pressure or under a vacuum ambient.

UV annealing is a preferred method conducted under the following conditions.

The environment can be inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.) or reducing (dilute or concentrated hydrogen, hydrocarbons (saturated, unsaturated, linear or branched, aromatics), etc.). The pressure is preferably about 1 Torr to about 1000 Torr. However, a vacuum ambient is preferred for thermal annealing as well as any other post-treating means. The temperature is preferably 200-500° C., and the temperature ramp rate is from 0.1 to 100 deg ° C./min. The total UV annealing time is preferably from 0.01 min to 12 hours.

The invention will be illustrated in more detail with reference to the following Examples, but it should be understood that it is not deemed to be limited thereto. It is also recognized that the precursors described in this invention can also be used to deposit porous low k films with similar process advantages relative to existing porous low k films (that is a greater resistance to plasma induced damage and equivalent or higher mechanical properties for a given value of the dielectric constant).

EXAMPLES

All experiments were performed on a 300 mm AMAT Producer SE, which deposits films on two wafers at the same time. Thus, the precursor and gas flow rates correspond to the flow rates required to deposit films on two wafers at the same time. The stated RF power per wafer is correct, as each wafer processing station has its own independent RF power supply. The stated deposition pressure is correct, as both wafer processing stations are maintained at the same pressure. After deposition, some films were subjected to UV curing or annealing. UV curing was performed on a 300 mm AMAT Producer® Nanocure™ UV cure module, with the wafer held under a helium gas flow at one or more pressures below 10 Torr and at one or more temperatures equal to or less than 400° C.

Although illustrated and described above with reference to certain specific embodiments and examples, the present invention is nevertheless not intended to be limited to the details shown. Rather, various modifications may be made in the details within the scope and range of equivalents of the claims and without departing from the spirit of the invention. It is expressly intended, for example, that all ranges broadly recited in this document include within their scope all narrower ranges which fall within the broader ranges. It is also recognized that the alkoxydisiloxanes disclosed in this invention can be used as a structure former for the deposition of porous low k films with a high elastic modulus, a high XPS carbon content, and a high resistance to plasma induced damage.

Thickness and refractive index were measured on a Woollam model M2000 Spectroscopic Ellipsometer. Dielectric constants were determined using Hg probe technique on mid-resistivity p-type wafers (range 8-12 ohm-cm). FTIR spectra were measured using a Thermo Fisher Scientific Model iS50 spectrometer fitted with a nitrogen purged Pike Technologies Map300 for handling 12-inch wafers. FTIR spectra were used to calculate the relative density of bridging disilylmethylene groups in the film. The relative density of bridging disilylmethylene groups in the film (i.e., the $SiCH_2Si$ density), as determined by infrared spectroscopy, is defined as 1E4 times the area of the $SiCH_2Si$ infrared band centered near 1360 $cm^{-1}$ divided by the area of the SiO bands between approximately 1250 $cm^{-1}$ to 920 $cm^{-1}$. FTIR spectra were used to calculate the relative density of terminal silicon methyl groups in the film. The relative density of terminal silicon methyl groups in the film (i.e., the $Si(CH_3)_x$ (x=1, 2, 3) density, as determined by infrared spectroscopy, is defined as 1E2 times the area of the $Si(CH_3)_x$ infrared band centered near 1273 $cm^{-1}$ divided by the area of the SiO bands between approximately 1250 $cm^{-1}$ to 920 $cm^{-1}$. The percentage of the total carbon in a film that is comprised of $SiCH_2Si$ groups, as defined by the ratio of the relative density of $SiCH_2Si$ groups as determined by IR spectroscopy to the value of total carbon content of the film as measured by XPS divided by 100. This ratio was calculated using the experimental value of the relative density of $SiCH_2Si$ groups as determined by IR spectroscopy (up to 4 significant figures) and the experimental value of the XPS carbon content (up to 4 significant figures) before rounding (for example, for the IPOTMDS based inventive example 1 film, the ratio is actually 97 after rounding not 24/(25/100) =96 as shown in Table 1). The reported ratio of the relative density of $SiCH_2Si$ groups as determined by IR spectroscopy to the value of total carbon content of the film as measured by XPS divided by 100 in Tables 1-4 was rounded to the nearest whole number. Mechanical properties were determined using a KLA iNano Nano Indenter.

Compositional data were obtained by X-ray photoelectron spectroscopy (XPS). XPS was performed using Thermo Fisher Thermo K-Alpha XPS with an Aluminum K-Alpha 1486.68 eV source and the detector is at normal angle to the sample surface. Instrument is calibrated using an internal Au standard before each measurement. Bulk composition is examined after sputtering ~ the top 20 nm of materials using 1 keV $Ar^+$ sputtering gun. The atomic weight percent (%) values reported do not include hydrogen.

Dynamic SIMS profiles were acquired using a continuous, focused beam of low energy Cs+ ions to remove material from the surface of the low k films by sputtering. Low energy Cs+ ions were used to reduce atomic mixing due to the collision cascades and to maximize depth resolution. Sputter rates were calibrated by sputtering down very close to the film-wafer interface and then measuring the sputtered depth with a stylus profilometer. RBS/HFS data of dense low k films similar to those being analyzed were used to quantify the SIMS profiles. The parameters used to acquire the dynamic SIMS depth profiles were the same for all plasma damaged low k films investigated.

For each precursor in the examples listed below the deposition conditions were optimized to yield films with high mechanical strength at the targeted dielectric constant.

Although illustrated and described above with reference to certain specific embodiments and examples, the present invention is nevertheless not intended to be limited to the details shown. Rather, various modifications may be made in the details within the scope and range of equivalents of the claims and without departing from the spirit of the invention. It is expressly intended, for example, that all ranges broadly recited in this document include within their scope all narrower ranges which fall within the broader ranges. It is also recognized that the alkoxydisiloxanes disclosed in this invention can be used as a structure former for the deposition of porous low k films with a high resistance to plasma induced damage and high mechanical properties.

Synthetic Example 1: Synthesis of 1-iso-propoxy-1,1,3,3-tetramethyldisiloxane 93.7 g (1.56 mol) isopropyl alcohol (anhydrous) was added drop-wise to 209 g (1.56 mol) of the 1,1,3,3-tetramethyldisiloxane and 0.01% molar loading of a catalyst in 1.25 L of anhydrous THF at room temperature. After the course of a day, GC-MS indicated formation of desired product m/z 192. GC indicated a 9:1 ratio of desired product to the bis-substituted. Solvent was removed by distillation at atmospheric pressure. The product was isolated in the amount of 221.8 g at a vapor temperature of 51° C. under 28 Torr vacuum and was 95% pure. The yield was 74%.

Synthetic Example 2: Synthesis of 1-sec-butoxy-1,1,3,3-tetramethyldisiloxane 0.21 g (2.8 mmol) 2-butanol was added drop-wise to 0.38 g (2.8 mmol) of the 1,1,3,3-tetramethyldisiloxane and 0.03% molar loading of a catalyst in 3 mL of anhydrous THF at room temperature. After one hour, GC-MS indicated formation of desired product m/z 206.

Synthetic Example 3: Synthesis of 1-tert-butoxy-1,1,3,3-tetramethyldisiloxane 0.21 g (2.8 mmol) t-butanol was added drop-wise to 0.38 g (2.8 mmol) of the 1,1,3,3-tetramethyldisiloxane and 0.03% molar loading of a catalyst in 3 mL of anhydrous THF at room temperature. After one hour, GC-MS indicated formation of desired product m/z 206.

Synthetic Example 4: Synthesis of 1-cyclohexoxy-1,1,3,3-tetramethyldisiloxane 0.28 g (2.8 mmol) cyclohexanol was added drop-wise to 0.38 g (2.8 mmol) of the 1,1,3,3-tetramethyldisiloxane and 0.03% molar loading of a catalyst in 3 mL of anhydrous THF at room temperature. After one hour, GC-MS indicated formation of desired product m/z 232.

Other compounds were made via similar fashion as Example 1 to 4 and were characterized by GC-MS. The molecular weight (MW), the structure, and corresponding major MS fragmentation peaks of each compound are provided below to confirm their identification as below.

| Chemical Name | Molecular Weight | Structure | MS |
|---|---|---|---|
| 1-ethoxy-1,1,3,3-tetramethyldisiloxane | 178.38 | 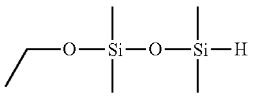 | 178, 163, 149, 135, 119, 103, 89, 73, 59, 45. |
| 1-iso-propoxy-1,1,3,3-tetramethyldisiloxane | 192.41 | 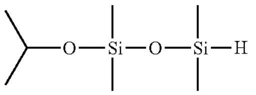 | 192, 178, 149, 133, 119, 103, 89, 73, 66, 59, 43. |
| 1-n-propoxy-1,1,3,3-tetramethyldisiloxane | 192.41 | 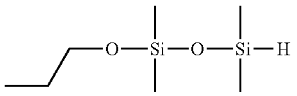 | 192, 177, 163, 149, 135, 119, 103, 89, 81, 73, 66, 59, 43. |
| 1-sec-butoxy-1,1,3,3-tetramethyldisiloxane | 206.43 | 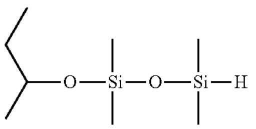 | 206, 191, 177, 149, 133, 119, 103, 89, 73, 66, 59, 43. |
| 1-tert-butoxy-1,1,3,3-tetramethyldisiloxane | 206.43 | 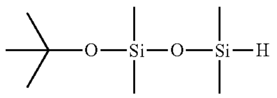 | 206, 191, 177, 163, 149, 133, 119, 103, 95, 89, 73, 66, 57, 43. |
| 1-tert-pentoxy-1,1,3,3-tetramethyldisiloxane | 220.46 | 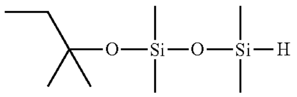 | 220, 205, 191, 175, 161, 149, 133, 119, 103, 95, 88, 81, 73, 66, 59, 43 |
| 1-cyclopentoxy-1,1,3,3-tetramethyldisiloxane | 218.44 | 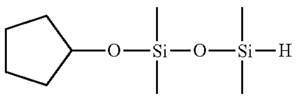 | 218, 203, 189, 175, 159, 149, 135, 119, 103, 94, 87, 73, 69, 59, 45, 41 |

-continued

| Chemical Name | Molecular Weight | Structure | MS |
|---|---|---|---|
| 1-cyclohexoxy-1,1,3,3-tetramethyldisiloxane | 232.47 | 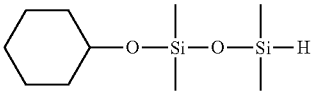 | 232, 217, 189, 175, 159, 149, 135, 119, 103, 83, 73, 67, 55, 41 |
| 1-ethoxy-1,1,3,3,3-pentamethyldisiloxane | 192.41 | 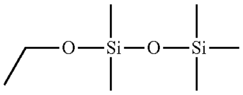 | 192, 177, 149, 133, 115, 103, 89, 73, 66, 59, 45 |
| 1-iso-propoxy-1,1,3,3,3-pentamethyldisiloxane | 206.43 | 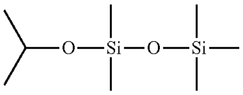 | 206, 191, 175, 149, 133, 115, 103, 88, 73, 66, 59, 43 |
| 1-n-propoxy-1,1,3,3,3-pentamethyldisiloxane | 206.43 | 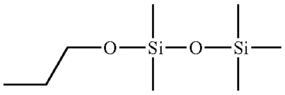 | 206, 191, 177, 147, 133, 119, 103, 87, 81, 73, 66, 59, 43 |
| 1-sec-butoxy-1,1,3,3,3-pentamethyldisiloxane | 220.46 | 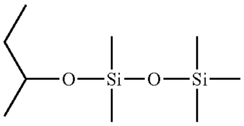 | 220, 205, 191, 175, 149, 133, 115, 103, 88, 73, 66, 59, 45 |
| 1-tert-butoxy-1,1,3,3,3-pentamethyldisiloxane | 220.46 | 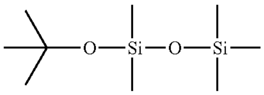 | 220, 205, 189, 175, 149, 133, 115, 103, 95, 87, 73, 66, 57, 45 |
| 1-tert-pentoxy-1,1,3,3,3-pentamethyldisiloxane | 234.49 | 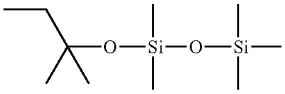 | 234, 219, 205, 189, 175, 149, 133, 117, 102, 95, 87, 81, 73, 66, 59, 43 |
| 1-cyclopentoxy-1,1,3,3,3-pentamethyldisiloxane | 232.47 | 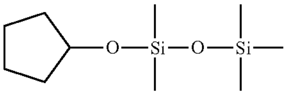 | 232, 217, 203, 189, 175, 149, 133, 115, 103, 94, 87, 73, 66, 59, 45 |
| 1-cyclohexoxy-1,1,3,3,3-pentamethyldisiloxane | 246.50 | 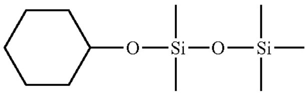 | 246, 231, 217, 203, 175, 149, 133, 119, 103, 94, 83, 73, 66, 55, 45 |
| 1,3-diethoxy-1,1,3,3-tetramethyldisiloxane | 222.43 | 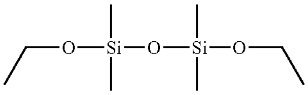 | 222, 207, 177, 163, 151, 133, 119, 103, 89, 75, 66, 59, 45. |
| 1,3-diiso-propoxy-1,1,3,3-tetramethyldisiloxane | 250.49 | 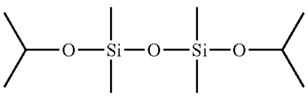 | 250, 236, 207, 192, 178, 165, 151, 133, 119, 110, 103, 96, 88, 75, 66, 59, 43 |
| 1,3-di-sec-butoxy-1,1,3,3-tetramethyldisiloxane | 278.54 | 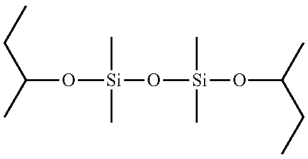 [SMILES: CCC(C)O[Si](C)(C)O[Si](C)(C)OC(C)CC] | 278, 263, 249, 205, 191, 177, 175, 149, 133, 119, 103, 95, 88, 75, 73, 66, 57, 41 |
| 1,3-di-n-propoxy-1,1,3,3-tetramethyldisiloxane | 250.49 | 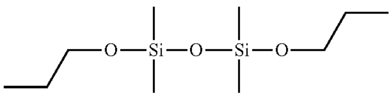 | 250, 235, 191, 177, 163, 151, 133, 119, 103, 96, 81, 75, 66, 59, 43 |

-continued

| Chemical Name | Molecular Weight | Structure | MS |
|---|---|---|---|
| 1,3-di-tert-butoxy-1,1,3,3-tetramethyldisiloxane | 278.54 | 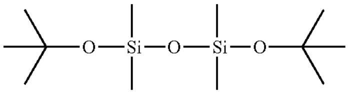 [SMILES: CC(C)(C)O[Si](C)(C)O[Si](C)(C)OC(C)(C)C] | 278, 263, 205, 189, 173, 149, 133, 124, 119, 103, 95, 87, 75, 73, 66, 57, 41 |
| 1,3-di-cyclopentoxy-1,1,3,3-tetramethyldisiloxane | 302.56 | 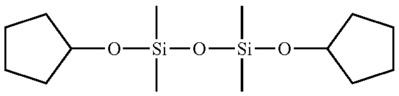 [SMILES: C[Si](C)(OC1CCCC1)O[Si](C)(C)OC1CCCC1] | 302, 287, 233, 219, 205, 191, 175, 167, 151, 133, 119, 103, 94, 89, 73, 67, 59, 45, 41 |
| 1,3-di-cyclohexoxy-1,1,3,3-tetramethyldisiloxane | 330.62 | 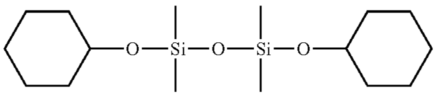 | 330, 315, 281, 247, 233, 205, 189, 175, 167, 151, 133, 119, 103, 94, 83, 67, 55, 41 |

Comparative Example 1: Deposition of a Dense OSG Film from Diethoxymethylsilane (DEMS®)

A dense DEMS® based film was deposited using the following process conditions for 300 mm processing. The DEMS® precursor was delivered to the reaction chamber via direct liquid injection (DLI) at a flow rate of 2500 mg/min using 1250 standard cubic centimeters per minute (sccm) He carrier gas flow, 25 sccm $O_2$, 380 milli-inch showerhead/heated pedestal spacing, 350° C. pedestal temperature, 7.5 Torr chamber pressure to which a 615 Watt 13.56 MHz plasma was applied. Various attributes of the film (e.g., dielectric constant (k), elastic modulus and hardness, relative densities of $Si(CH_3)_x$ and $SiCH_2Si$ by infrared spectra, and atomic composition by XPS (atomic percent carbon, atomic percent oxygen, and atomic percent silicon)) were obtained as described above and are provided in Table 1.

Comparative Example 2: Deposition of a Dense OSG Film from 1-Methyl-1-Iso-propoxy-1-Silacyclopentane (MIPSCP)

A dense 1-methyl-1-iso-propoxy-1-silacyclopentane (MIPSCP) based film was deposited using the following process conditions for 300 mm processing. The 1-methyl-1-iso-propoxy-1-silacyclopentane precursor was delivered to the reaction chamber via direct liquid injection (DLI) at a flow rate of 850 mg/min using 750 standard cubic centimeters per minute (sccm) He carrier gas flow, 8 sccm $O_2$, 380 milli-inch showerhead/heated pedestal spacing, 390° C. pedestal temperature, 7.5 Torr chamber pressure to which a 275 Watt 13.56 MHz plasma was applied. Various attributes of the film (e.g., dielectric constant (k), elastic modulus and hardness, relative densities of $Si(CH_3)_x$ and $SiCH_2Si$ by infrared spectra, and atomic composition by XPS (atomic percent carbon, atomic percent oxygen, and atomic percent silicon)) were obtained as described above and are provided in Table 1.

Comparative Example 3: Deposition of a Dense OSG Film from DEMS®

A dense DEMS® based film was deposited using the following process conditions for 300 mm processing. The DEMS® precursor was delivered to the reaction chamber via direct liquid injection (DLI) at a flow rate of 1500 mg/min using 1500 standard cubic centimeters per minute (sccm) He carrier gas flow, 75 sccm $O_2$, 380 milli-inch showerhead/heated pedestal spacing, 350° C. pedestal temperature, 7.5 Torr chamber pressure to which a 465 Watt 13.56 MHz plasma was applied. Various attributes of the film (e.g., dielectric constant (k), elastic modulus and hardness, relative densities of $Si(CH_3)_x$ and $SiCH_2Si$ by infrared spectra, and atomic composition by XPS (atomic percent carbon, atomic percent oxygen, and atomic percent silicon)) were obtained as described above and are provided in Table 2.

Comparative Example 4: Deposition of a Dense OSG Film from DEMS®

A dense DEMS® based film was deposited using the following process conditions for 300 mm processing. The DEMS® precursor was delivered to the reaction chamber via direct liquid injection (DLI) at a flow rate of 2000 mg/min using 1500 standard cubic centimeters per minute (sccm) He carrier gas flow, 25 sccm $O_2$, 380 milli-inch showerhead/heated pedestal spacing, 350° C. pedestal temperature, 7.5 Torr chamber pressure to which a 217 Watt 13.56 MHz plasma was applied. Various attributes of the film (e.g., dielectric constant (k), elastic modulus and hardness, relative densities of $Si(CH_3)_x$ and $SiCH_2Si$ by infrared spectra, and atomic composition by XPS (atomic percent carbon, atomic percent oxygen, and atomic percent silicon)) were obtained as described above and are provided in Table 3.

Inventive Example 1: Deposition of a Dense OSG Film from 1-iso-propoxy-1,1,3,3-tetramethyldisiloxane An organosilicate (OSG) film is deposited using 1-iso-propoxy-1,1,3,3-tetramethyldisiloxane as a silicon precursor. The deposition conditions for depositing the composite film on a 300 mm wafer are as follows: The precursor is delivered to the reaction chamber via direct liquid injection (DLI) at a flow rate of 1399 milligrams/minute (mg/min) of 1-iso-propoxy-1,1,3,3-tetramethyldisiloxane, 975 standard cubic centimeters per minute (sccm) helium carrier gas flow, 19 sccm $O_2$, 380 milli-inch showerhead/wafer spacing, 400° C. wafer chuck temperature, 6.7 Torr chamber pressure to which a 427 W plasma was applied. Various attributes of the film (e.g., dielectric constant (k), elastic modulus and hardness, relative densities of $Si(CH_3)_x$ and $SiCH_2Si$ by infrared spectra, and atomic composition by XPS (atomic percent carbon, atomic percent oxygen, and atomic percent silicon)) were obtained as described above and are provided in Tables 1 and 3.

Inventive Example 2: Deposition of a Dense OSG Film from 1-ethoxy-1,1,3,3-tetramethyldisiloxane An organosilicate (OSG) film is deposited using 1-ethoxy-1,1,3,3-tetramethyldisiloxane as a silicon precursor. The deposition conditions for depositing the composite film on a 300 mm wafer are as follows: The precursor is delivered to the reaction chamber via direct liquid injection (DLI) at a flow rate of 1400 milligrams/minute (mg/min) of 1-ethoxy-1,1,3,3-tetramethyldisiloxane, 925 standard cubic centimeters per minute (sccm) helium carrier gas flow, 19 sccm $O_2$, 380 milli-inch showerhead/wafer spacing, 400° C. wafer chuck temperature, 6.7 Torr chamber pressure to which a 425 W plasma was applied. Various attributes of the film (e.g., dielectric constant (k), elastic modulus and hardness, relative densities of $Si(CH_3)_x$ and $SiCH_2Si$ by infrared spectra, and atomic composition by XPS (atomic percent carbon, atomic percent oxygen, and atomic percent silicon)) were obtained as described above and are provided in Table 1.

Inventive Example 3: Deposition of a Dense OSG Film from 1-iso-propoxy-1,1,3,3-tetramethyldisiloxane An organosilicate (OSG) film is deposited using 1-iso-propoxy-1,1,3,3-tetramethyldisiloxane as a silicon precursor. The deposition conditions for depositing the composite film on a 300 mm wafer are as follows: The precursor is delivered to the reaction chamber via direct liquid injection (DLI) at a flow rate of 800 milligrams/minute (mg/min) of 1-iso-propoxy-1,1,3,3-tetramethyldisiloxane, 975 standard cubic centimeters per minute (sccm) helium carrier gas flow, 8 sccm $O_2$, 380 milli-inch showerhead/wafer spacing, 400° C. wafer chuck temperature, 6.7 Torr chamber pressure to which a 375 W plasma was applied. Various attributes of the film (e.g., dielectric constant (k), elastic modulus and hardness, relative densities of $Si(CH_3)_x$ and $SiCH_2Si$ by infrared spectra, and atomic composition by XPS (atomic percent carbon, atomic percent oxygen, and atomic percent silicon)) were obtained as described above and are provided in Table 2.

Inventive Example 4: Deposition of a Dense OSG Film from 1-ethoxy-1,1,3,3-tetramethyldisiloxane An organosilicate (OSG) film is deposited using 1-ethoxy-1,1,3,3-tetramethyldisiloxane as a silicon precursor. The deposition conditions for depositing the composite film on a 300 mm wafer are as follows: The precursor is delivered to the reaction chamber via direct liquid injection (DLI) at a flow rate of 1400 milligrams/minute (mg/min) of 1-ethoxy-1,1,3,3-tetramethyldisiloxane, 925 standard cubic centimeters per minute (sccm) helium carrier gas flow, 8 sccm $O_2$, 380 milli-inch showerhead/wafer spacing, 400° C. wafer chuck temperature, 6.7 Torr chamber pressure to which a 350 W plasma was applied. Various attributes of the film (e.g., dielectric constant (k), elastic modulus and hardness, relative densities of $Si(CH_3)_x$ and $SiCH_2Si$ by infrared spectra, and atomic composition by XPS (atomic percent carbon, atomic percent oxygen, and atomic percent silicon)) were obtained as described above and are provided in Table 2.

Inventive Example 5: Deposition of a Dense OSG Film from 1-iso-proxy-1,1,3,3-tetramethyldisiloxane An organosilicate (OSG) film is deposited using 1-iso-proxy-1,1,3,3-tetramethyldisiloxane as a silicon precursor. The deposition conditions for depositing the composite film on a 300 mm wafer are as follows: The precursor is delivered to the reaction chamber via direct liquid injection (DLI) at a flow rate of 800 milligrams/minute (mg/min) of 1-iso-proxy-1,1,3,3-tetramethyldisiloxane, 975 standard cubic centimeters per minute (sccm) helium carrier gas flow, 30 sccm $O_2$, 380 milli-inch showerhead/wafer spacing, 400° C. wafer chuck temperature, 6.7 Torr chamber pressure to which a 410 W plasma was applied. Various attributes of the film (e.g., dielectric constant (k), elastic modulus and hardness, relative densities of $Si(CH_3)_x$ and $SiCH_2Si$ by infrared spectra, and atomic composition by XPS (atomic percent carbon, atomic percent oxygen, and atomic percent silicon)) were obtained as described above and are provided in Table 4.

The amount of terminal $Si(CH_3)$ groups chemically incorporated into a low k film affects both the dielectric constant and the mechanical strength. Increasing the amount of terminal $Si(CH_3)$ groups lowers the dielectric constant and decreases the mechanical strength of the film. FIG. 1 provides an illustration of the predicted bulk modulus of a low k film in which methyl groups are added per silicon atom in the network. FIG. 1 shows that the bulk modulus continuously drops as additional methyl groups are added. However, if there are too few $Si(CH_3)$ groups within the film the dielectric constant may be adversely affected. Therefore, it is desirable to have a means of limiting the percentage of Si atoms substituted with terminal methyl groups for a given dielectric constant as this may maximize the mechanical properties. It is even more desirable to have a means of adding carbon to the film in the form of $SiCH_2Si$ bridging groups. Incorporating carbon in the form of a bridging group is desirable because, from a mechanical strength point of view, the network structure is not disrupted by increasing the carbon content and higher mechanical strengths can be achieved relative to incorporating the same amount of carbon in the film in the form of terminal $Si(CH_3)_x$ groups. Adding carbon to the film in the form of $SiCH_2Si$ bridging groups also allows the film to be more resilient to carbon depletion of the OSG film from processes such as etching of the film, plasma ashing of photoresist, and $NH_3$ plasma treatment of copper surfaces. Carbon depletion in the OSG films can cause increases in the effective dielectric constant of the film, problems with film etching and feature bowing during wet cleaning steps, and/or integration issues when depositing copper diffusion barriers.

Table 1 shows that films with a dielectric constant of 3.0 made using the alkoxydisiloxane precursors described in this invention such as, for example IPOTMDS, and EOTMDS, as the structure former have equivalent or greater mechanical strength relative to films made using the DEMS® structure former or the MIPSCP structure former at the same value of the dielectric constant. Similarly, Table 2 shows that films with a dielectric constant of 3.1 made using the alkoxydisiloxane precursors described in this invention such as, for example IPOTMDS, and EOTMDS, as the structure former have equivalent or greater mechanical strength relative to films made using the DEMS® structure former at the same value of the dielectric constant.

TABLE 1

Comparative Film Properties for dense OSG films deposited using DEMS ®, MIPSCP, IPOTMDS, and EOTMDS.

| Parameter | DEMS ® Based Comparative Example 1 | MIPSCP Based Comparative Example 2 | IPOTMDS Based Inventive Example 1 | EOTMDS Based Inventive Example 2 |
|---|---|---|---|---|
| Dielectric Constant | 3.0 | 3.0 | 3.0 | 3.0 |
| Elastic Modulus (GPa) | 15 | 18 | 18 | 19 |
| Hardness (GPa) | 2.2 | 2.8 | 2.7 | 3.1 |
| at. % Carbon (XPS) | 18 | 34 | 25 | 28 |
| at. % Oxygen (XPS) | 45 | 33 | 39 | 37 |
| at. % Silicon (XPS) | 37 | 33 | 36 | 35 |
| Relative $SiCH_2Si$ Density* | 6 | 19 | 24 | 22 |
| Relative $Si(CH_3)_x$ Density* | 2.5 | 2.7 | 3.0 | 3.0 |
| Relative $SiCH_2Si$ Density*/(XPS C, at. %/100) | 33 | 56 | 97 | 77 |
| Depth of Carbon Removal or Depth of Plasma Induced Damage (nm) | 24 | 15 | 15 | Not Collected |

*As determined by IR spectroscopy.

Consider the data in Table 1 for films with a dielectric constant of 3.0. The elastic modulus of the inventive IPOTMDS based film in Table 1 is 20% greater than that of the comparative DEMS® based film, and the elastic modulus of the inventive EOTMDS based film in Table 1 is 27% greater than that of the comparative DEMS® based film. The elastic modulus of both the inventive IPOTMDS and EOTMDS based films are similar to the elastic modulus of the comparative MIPSCP based film. However, based on the computer modeling work in FIG. 1 the film with the lowest density of $Si(CH_3)$ groups would be expected to have the highest mechanical strength and the film with the highest density of $Si(CH_3)$ groups would be expected to have the lowest mechanical strength. As shown in Table 1, this is not the case. To illustrate, the relative $Si(CH_3)$ density of the films (as determined from their infrared spectra) made using the alkoxydisiloxane precursors described in this invention, IPOTMDS, and EOTMDS are 20% greater than the $Si(CH_3)$ density of the comparative DEMS® based film. Yet the elastic modulus and hardness of the films made using the alkoxydisiloxane precursors described in this invention, IPOTMDS, and EOTMDS, are greater than the elastic modulus and hardness of the film made using the prior art structure former DEMS®. Similarly, the comparative MIPSCP based film has a higher $Si(CH_3)$ density (+8%) and higher mechanical strength (+20%) than that of the comparative DEMS® based film. Thus, the films made using the alkoxydisiloxane precursors described in this invention such as, for example IPOTMDS and EOTMDS, and the film made using MIPSCP, have a higher $Si(CH_3)$ density and higher mechanical strength than the film made using the prior art structure former DEMS®. This is unexpected and indicates that factors other than the $Si(CH_3)$ density are contributing to the mechanical strength in these films.

TABLE 2

Comparative Film Properties for dense OSG films deposited using DEMS ®, TMIPODS, and TMEODS.

| Parameter | DEMS ® Based Comparative Example 3 | IPOTMDS Based Inventive Example 3 | EOTMDS Based Inventive Example 4 |
|---|---|---|---|
| Dielectric Constant | 3.1 | 3.1 | 3.1 |
| Elastic Modulus (GPa) | 17 | 22 | 20 |
| Hardness (GPa) | 2.4 | 3.5 | 3.2 |
| at. % Carbon (XPS) | 14 | 26 | 25 |
| at. % Oxygen (XPS) | 48 | 37 | 40 |
| at. % Silicon (XPS) | 38 | 37 | 35 |
| Relative $SiCH_2Si$ Density* | 7 | 28 | 25 |
| Relative $Si(CH_3)_x$ Density* | 2.2 | 2.9 | 3.0 |
| Relative $SiCH_2Si$ Density*/(XPS C, at. %/100) | 47 | 107 | 99 |

*As determined by IR spectroscopy.

Consider the data in Table 2 for films with a dielectric constant of 3.1. The elastic modulus of the inventive IPOTMDS based film in Table 2 is 29% greater than that of the comparative DEMS® based film, and the elastic modulus of the inventive EOTMDS based film in Table 1 is 18% greater than that of the comparative DEMS® based film. The $Si(CH_3)$ densities in the films made using the inventive alkoxydisiloxane precursors are greater than the $Si(CH_3)$ density of the film made using the prior art precursor DEMS®. For example, the $Si(CH_3)$ density of the film made using the inventive alkoxydisiloxane precursor IPOTMDS is 32% greater than the $Si(CH_3)$ density of the comparative DEMS® based film while $Si(CH_3)$ density of the film made using the inventive alkoxydisiloxane precursor EOTMDS is 36% greater than the $Si(CH_3)$ density of the comparative DEMS® based film. It is unexpected that the films made using the alkoxydisiloxane precursors such as, for example IPOTMDS and EOTMDS, have both a higher $Si(CH_3)$ density and a higher mechanical strength relative to the comparative DEMS® based film. This indicates that factors other than the $Si(CH_3)$ density are contributing to the mechanical strength of these films.

Figure 2:
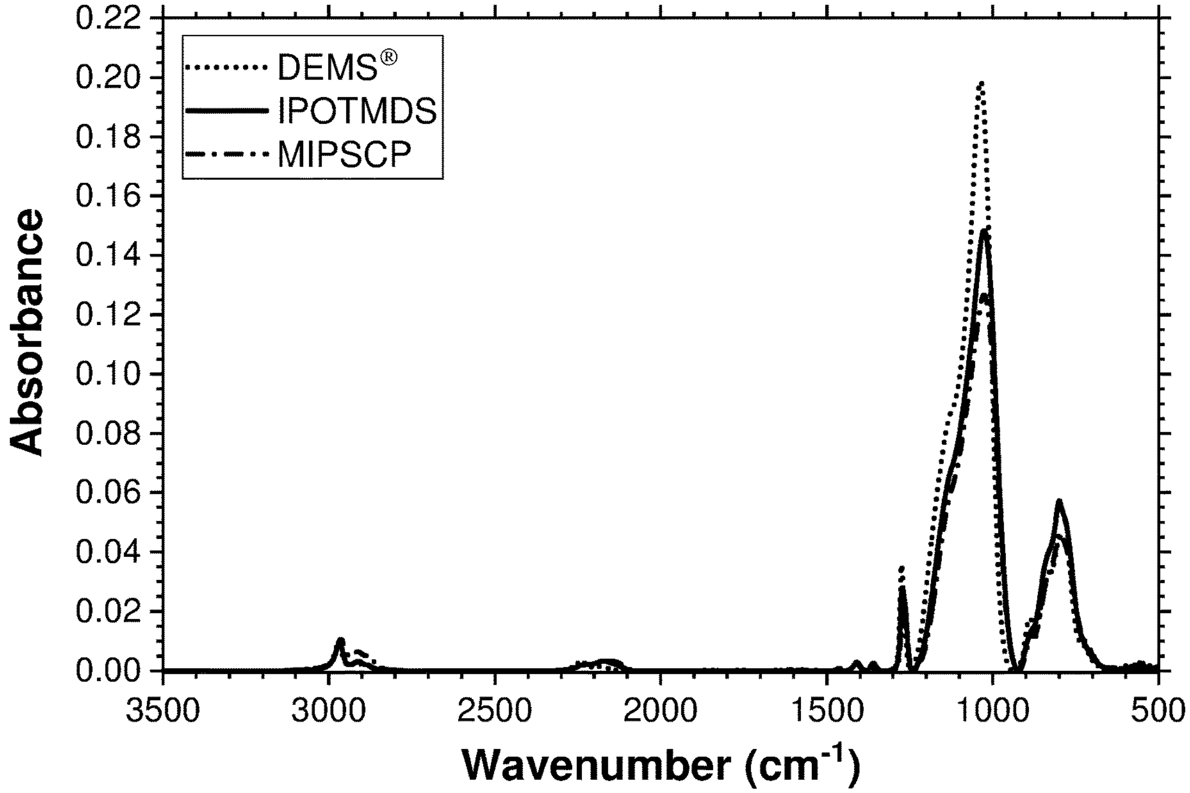
FIG. 2 shows the IR spectra between 3500 $cm^{-1}$ and 500 $cm^{-1}$ for comparative example 1, comparative example 2, and inventive example 1. Absorbencies were normalized to film thickness, background corrected for the bare Si wafer, and baseline offset for clarity.
Figure 3:
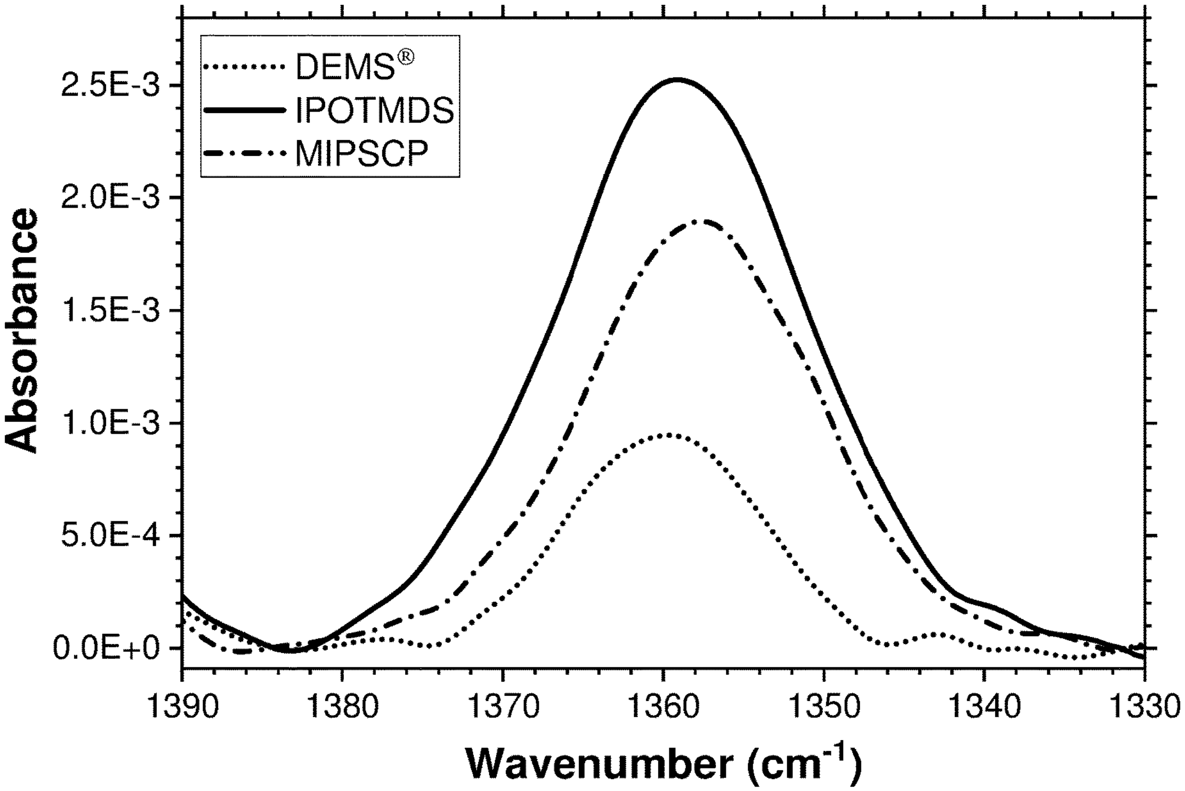
FIG. 3 shows the IR spectra between 1390 $cm^{-1}$ and 1330 $cm^{-1}$ for comparative example 1, comparative example 2, and inventive example 1. Absorbencies were normalized to film thickness, background corrected for the bare Si wafer, and baseline offset for clarity.

Transmission infrared spectra from 3500 $cm^{-1}$ to 500 $cm^{-1}$ are shown in FIG. 2 for the three different films summarized in Table 1; all three films have a dielectric constant of 3.0. FIG. 3 shows an expanded image of the disilylmethylene ($SiCH_2Si$) infrared band centered near 1360 $cm^{-1}$ for all three films. The peak absorbance of the $SiCH_2Si$ band for the films made using the IPOTMDS structure former precursor is more than two times greater than the peak absorbance of the $SiCH_2Si$ band for the film made using the DEMS® structure former precursor. The peak absorbance of the $SiCH_2Si$ band for the films made using the MIPSCP structure former precursor is approximately two times greater than the peak absorbance of the $SiCH_2Si$ band for the film made using the DEMS® structure former precursor. Thus, the infrared spectra indicate that the film made using the IPOTMDS structure former has a higher concentration of $SiCH_2Si$ groups relative to films made using the prior art MIPSCP structure former precursor and both the IPOTMDS and MIPSCP based films have a much higher concentration of $SiCH_2Si$ groups relative to the film made using the prior art DEMS® structure former precursor.

Table 1 shows that films with a dielectric constant of 3.0 made using the alkoxydisiloxane precursors described in this invention such as, for example IPOTMDS, and EOTMDS, have significantly greater $SiCH_2Si$ densities relative to films made using the DEMS® structure former or the MIPSCP structure former at the same value of the dielectric constant. Similarly, Table 2 shows that films with a dielectric constant of 3.1 made using the alkoxydisiloxane precursors described in this invention, IPOTMDS, and EOTMDS, have significantly greater $SiCH_2Si$ densities relative to films made using the DEMS® structure former at the same value of the dielectric constant.

Consider the data in Table 1 for films with a dielectric constant of 3.0. The $SiCH_2Si$ density of the inventive IPOTMDS based film in Table 1 is 300% greater than that of the comparative DEMS® based film, and the $SiCH_2Si$ density of the inventive EOTMDS based film in Table 1 is 267% greater than that of the comparative DEMS® based film. The $SiCH_2Si$ densities of both the inventive IPOTMDS and EOTMDS based films are at least 16% greater than the $SiCH_2Si$ density of the comparative MIPSCP based film. Consider the data in Table 2 for films with a dielectric constant of 3.1. The $SiCH_2Si$ density of the inventive IPOTMDS based film in Table 1 is 300% greater than that of the comparative DEMS® based film, and the $SiCH_2Si$ density of the inventive EOTMDS based film in Table 1 is 257% greater than that of the comparative DEMS® based film. Not to be bound by theory, the unexpected increase in mechanical strength with an increase in the $Si(CH_3)$ density of the films made using the alkoxydisiloxane structure former precursors IPOTMDS and EOTMDS relative to the comparative film made from DEMS® is due to their very high $SiCH_2Si$ densities relative to the comparative film made from DEMS®. To illustrate, the data in Tables 1 and 2 show that while the $Si(CH_3)$ density of the IPOTMDS and EOTMDS based films is ~20 to ~35% greater than the $Si(CH_3)$ density of the DEMS® based films at the same value of the dielectric constant, the $SiCH_2Si$ density of the IPOTMDS and EOTMDS based films is ~255 to 300% greater than the $SiCH_2Si$ density of the DEMS® based films at the same value of the dielectric constant. As incorporating carbon as bridging $SiCH_2Si$ groups within a low k film maintains the three-dimensional network structure and maintains or increases the mechanical strength of the film, the much greater increase in $SiCH_2Si$ density of the IPOTMDS and EOTMDS based films relative to the DEMS® based films must offset any decrease in mechanical strength resulting from the slight increase in $Si(CH_3)$ densities of the IPOTMDS and EOTMDS based films relative to the DEMS® based films.

In the case of the films made using the alkoxydisiloxane precursors having Formula (I) or Formula (II) according to the present invention it is believed that the precursor structure facilitates reactions in the plasma that convert a high percentage of the three or four terminal Si-Me groups ($Si(CH_3)$) in the structure former into bridging methylene groups (disilylmethylene, $SiCH_2Si$) in the network structure of the film. In this manner, one can incorporate carbon in the form of a bridging group so that, from a mechanical strength view, the network structure is not disrupted by increasing the carbon content in the film. This also adds carbon to the film, allowing the film to be more resilient to carbon depletion from processes such as etching of the film, plasma ashing of photoresist, and $NH_3$ plasma treatment of copper surfaces. Presumably in the case of IPOTMDS and EOTMDS the presence of four terminal silicon methyl groups in the precursor (two per silicon atom) favor the formation of high densities of disilylmethylene groups ($SiCH_2Si$) in the as deposited film relative to precursors containing fewer terminal methyl group per silicon atom such as the prior art structure former DEMS®. In the case of MIPSCP the formation of $SiCH_2Si$ groups is believed to also be due to the breakup of the cyclic structure during deposition. However, as shown in Table 1 the density of $SiCH_2Si$ groups in the films deposited from the inventive alkoxydisiloxane precursors IPOTMDS and EOTMDS is significantly greater than the density of $SiCH_2Si$ groups in films deposited from the comparative MIPSCP structure former at the same value of the dielectric constant. Indeed, low k films deposited from alkoxydisiloxane precursors as described by Formula (II) have resulted in the highest $SiCH_2Si$ densities of any low k film deposited in our laboratory. Thus, films deposited from the inventive alkoxydisiloxane precursors described by Formulas (I) and (II) such as, for example IPOTMDS and EOTMDS, have unexpectedly high mechanical properties and unexpectedly high $SiCH_2Si$ densities relative to films deposited from prior art structure formers such as, for example DEMS® and MIPSCP.

It is well established that the resistance to carbon removal from a dielectric film increases as the total carbon content of the film increases. For example, to the best of our knowledge films made using the prior art precursor 1-methyl-1-ethoxy-1-silacyclopentane or MESCP, or its derivatives such as, for example 1-methyl-1-ethoxy-1-silacyclopentane or MIPSCP, have been reported to have the strongest resistance to carbon removal when exposed to an $NH_3$ plasma of any have dense low k film deposited to date (U.S. Pat. No. 9,922,818). This is attributed to the very high carbon content of these films (typically >30%). This is illustrated in U.S. Pat. No. 9,922,818 where the depth of carbon removal following exposure to a $NH_3$ plasma for a low k film made using a combination of the MESCP structure former precursor and cyclooctane containing 36% carbon (XPS, atomic %) is 20% less (35 nm compared to 44 nm) than a low k film made using a combination of the DEMS® structure former precursor and cyclooctane containing 23% carbon (XPS, atomic %). Thus, if we compare the film deposited using the DEMS® structure former precursor (comparative film 1), the film deposited using the MIPSCP structure former precursor (comparative film 2), and the film deposited using the IPOTMDS structure former precursor (inventive film 1) given in Table 1 the film deposited using the MIPSCP structure former precursor should have the greatest resistance to carbon removal when exposed to an $NH_3$ plasma while the film deposited using the DEMS® structure former precursor should have the least resistance to carbon removal when exposed to an $NH_3$ plasma.

Figure 4:
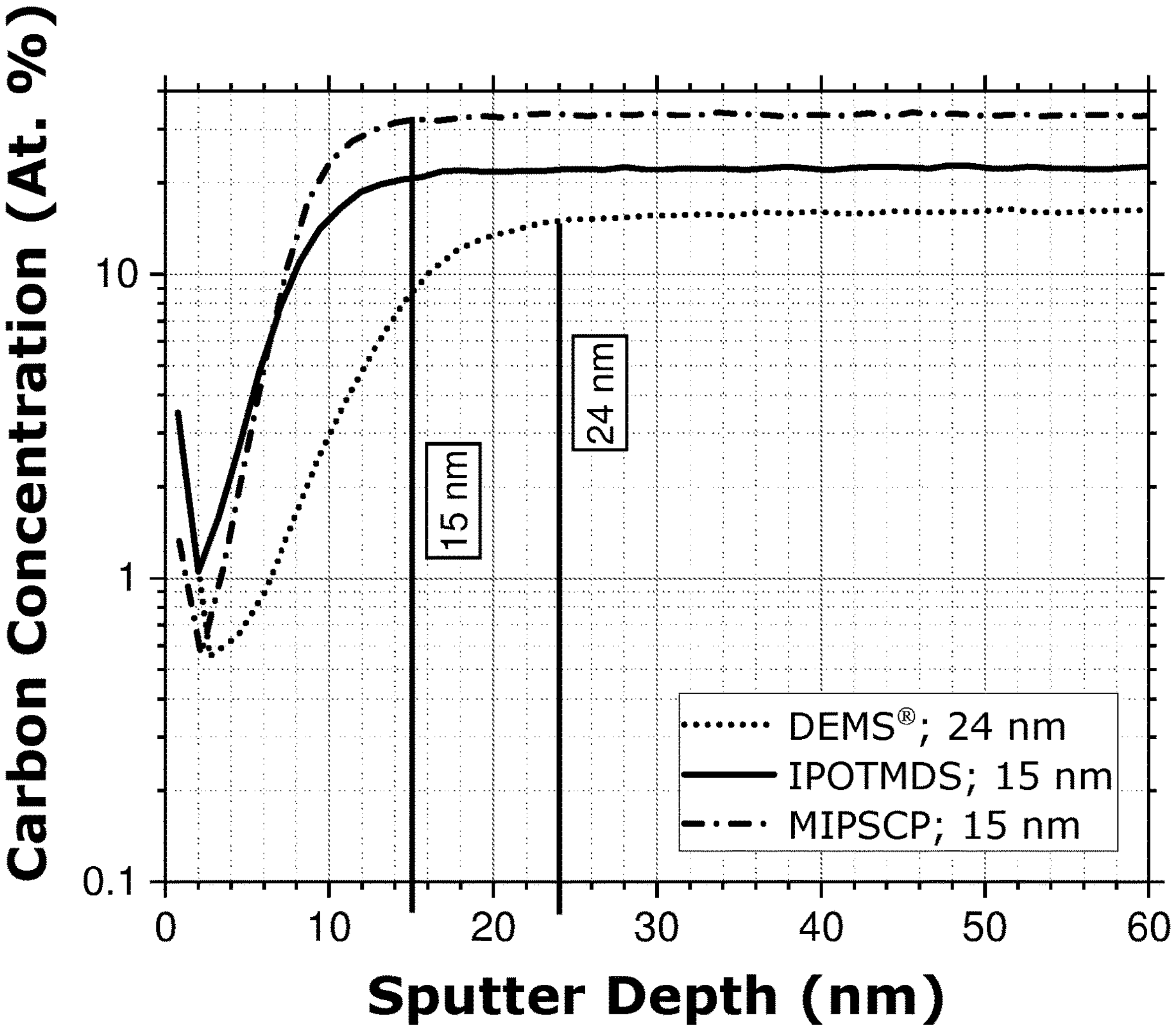
FIG. 4 demonstrates the resistance to carbon removal of comparative film 1, comparative film 2, and inventive film 1 after the films were damaged using an $NH_3$ plasma.

FIG. 4 shows the dynamic SIMS profiles of comparative film 1 (deposited using the DEMS® structure former), comparative film 2 (deposited using the MIPSCP structure former), inventive film 1 (deposited using the IPOTMDS structure former) after the films were damaged using an $NH_3$ plasma. All four films were exposed to a 25 second $NH_3$ plasma at 300 W plasma power to model the plasma damage conditions seen in integration. The depth of carbon removal (also denoted as the depth of plasma induced damage) is indicated by the depth to which the carbon was removed from the film as indicated by the dynamic SIMS depth profiling.

The depth of carbon removal after exposure to an $NH_3$ plasma is approximately 15 nm, as determined by SIMS depth profiling, for the films made using the IPOTMDS and MIPSCP structure former precursors, while the depth of carbon removal after exposure to an $NH_3$ plasma for the film made using the DEMS® structure former precursor is much higher, approximately 24 nm. The high depth of carbon removal for the film made using the DEMS® structure former precursor is expected as this film has the lowest total carbon content. Unexpectedly, the depth of carbon removal from the film made using MIPSCP is not the smallest, even though the MIPSCP based film has the greatest carbon content (34 atom % carbon as determined from its SIMS depth profile). More surprisingly, the film made using alkoxydisiloxane compound described in Formula (II), for example, IPOTMDS, has the same small depth of carbon removal, as determined by SIMS depth profiling, as the film made using the prior art MIPSCP structure former. This is quite unexpected, as the film made using the IPOTMDS structure former compound has a lower total carbon content (28% less carbon) relative to the film made using the MIPSCP structure former. This is another unique attribute of films made using alkoxydisiloxane compounds described in Formula (I) and Formula (II) such as, for example IPOTMDS and EOTMDS, which is that films made using alkoxydisiloxane compounds described in Formula (I) and Formula (II) have a much higher resistance to carbon removal when exposed to an $NH_3$ plasma than expected for films with a relatively low total carbon content (<~28 atomic %).

Not being bound by theory, the extremely high resistance to plasma induced damage in films made using the alkoxydisiloxane compounds described in Formula (I) and Formula (II) such as, for example IPOTMDS is attributed to a unique distribution of carbon in these films; a relatively low total carbon content (<~28 atomic %), with a high density of disilylmethylene groups (~>20, as determined by IR spectroscopy), and with a high percentage of the total carbon content being comprised of disilylmethylene groups (>60, as determined by a combination of IR spectroscopy and XPS). To illustrate, as shown in Table 1, the films made using the IPOTMDS and EOTMDS structure former precursors have the highest percentage of the total carbon content comprised of disilylmethylene groups (97 and 77, respectively) relative to the films made using the prior art structure formers MIPSCP (56) and DEMS® (33). Indeed, the prior art structure former MIPSCP was specifically designed to deposit films with a high percentage of carbon to provide strong resistance to carbon removal after exposure to an $NH_3$ plasma. While this film does contain a high percentage of total carbon (34 atomic %, as measured from its SIMS depth profile) and a high density of $SiCH_2Si$ groups as determined by its infrared spectrum, it also contains high densities of other forms of carbon, such as terminal methyl groups. The high total carbon content of MIPSCP based films limits the percentage of the total carbon content that can be comprised of disilylmethylene groups within MIPSCP based films. In contrast, films made using the IPOTMDS and EOTMDS structure former precursors have the highest percentage of the total carbon content comprised of disilylmethylene groups of any low k film that we are aware of. This is another unique attribute of films made using alkoxydisiloxane compounds described in Formula (I) and Formula (II) such as, for example IPOTMDS and EOTMDS, which is that films made using alkoxydisiloxane compounds described in Formula (I) and Formula (II) have the highest percentage of the total carbon content comprised of disilylmethylene groups of any known low k films and are comprised of a relatively low total carbon content (<~28 atomic %). This effect of this unique distribution of carbon is an unexpected high resistance to plasma induced damage that is equivalent to or greater than the resistance to plasma induced damage of films with a much greater total carbon content, such as MIPSCP based films. Thus, while a higher total carbon content in a low k dielectric film can provide a high resistance to carbon removal when exposed to an $NH_3$ plasma, the type of carbon in the film also plays a significant role.

Figure 5:
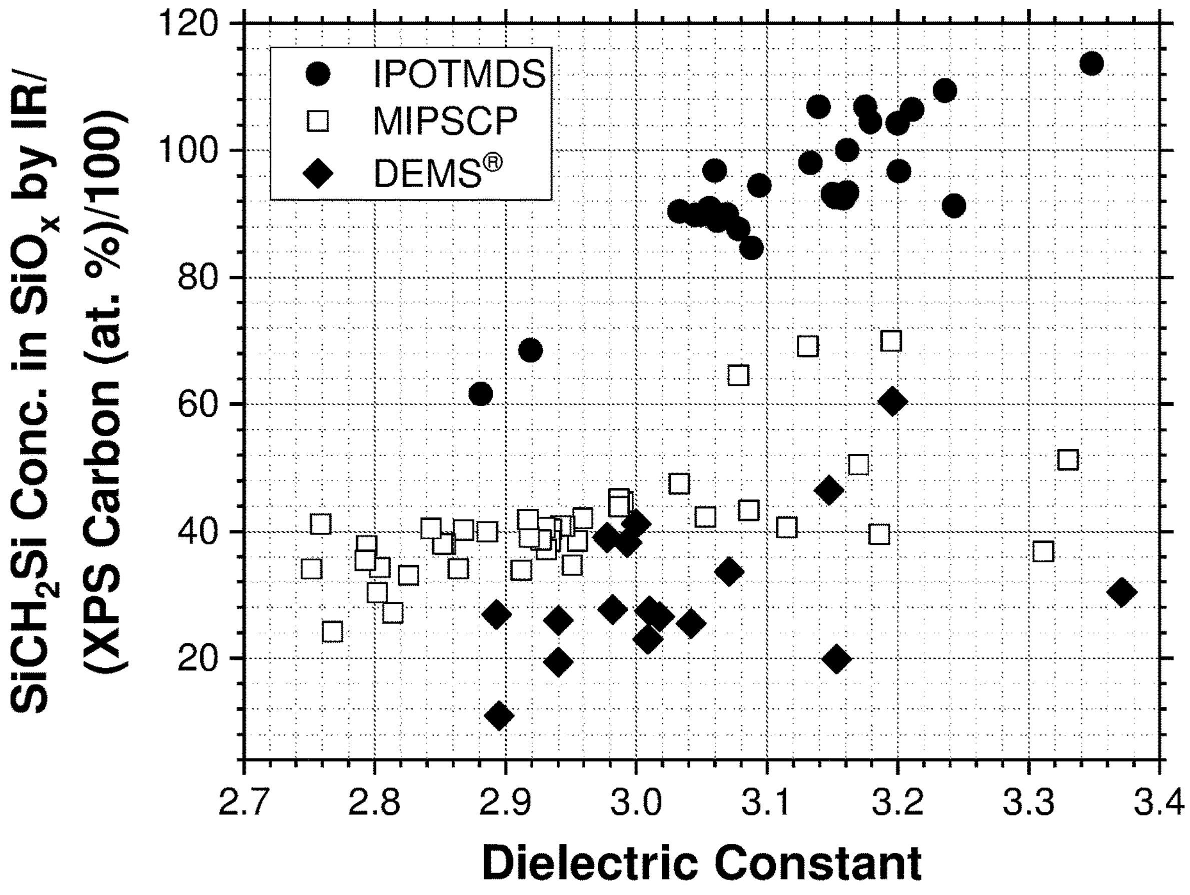
FIG. 5 shows the ratio of the relative $SiCH_2Si$ concentration determined by IR divided by the fraction of XPS carbon in the film for series of low dielectric films deposited using the inventive compound IPOTMDS relative to a series of low dielectric films deposited using the comparative compounds DEMS® and MIPSCP.

A series of depositions of dense low k dielectric films were deposited using either IPOTMDS, MIPSCP, or DEMS® as the low k precursor on a 300 mm PECVD reactor under a variety of process conditions from 225-615 Watts plasma power, 6.7-9.5 Torr chamber pressure, 350-400° C. substrate temperature, 0-125 sccm $O_2$ gas flow, 625-1550 sccm He carrier gas flow, 0.600 to 2.500 g/min of precursor liquid flow, and a 0.380 inch electrode spacing. The percentage of the total carbon content comprised of disilylmethylene groups for each film was calculated as the ratio of the relative density of $SiCH_2Si$ groups determined from its infrared spectra to the fraction of XPS carbon in the film (XPS carbon (atomic %)/100). FIG. 5 shows the relationship between the percentage of the total carbon content comprised of disilylmethylene groups for dense OSG films made using the IPOTMDS precursor, the MIPSCP precursor, and the DEMS® precursor having different dielectric constants. As FIG. 5 shows the prior art MIPSCP and DEMS® based low k films have a much lower percentage of the total carbon content comprised of disilylmethylene groups at the same value of the dielectric constant relative to IPOTMDS based films as the dielectric constant is increased from about 2.7 to about 3.4. This illustrates one of the important advantages of using alkoxydisiloxane compounds of Formula (I) and Formula (II) such as, for example IPOTMDS, for depositing a dense low k dielectric film which is for similar values of the dielectric constant, the alkoxydisiloxane precursor IPOTMDS can be used to deposit films with a percentage of the total carbon content comprised of disilylmethylene groups that is as high or higher than any other prior art structure formers. Thus, one of the unique attributes of films made using alkoxydisiloxane compounds of Formula (I) and Formula (II) such as, for example IPOTMDS, is that the total carbon content is rather low (<~28 atomic %) and a percentage of the total carbon content comprised of $SiCH_2Si$ groups is significantly greater than that of films made from prior art structure formers such as DEMS® and MIPSCP. Unexpectedly, this unique distribution of carbon results in a resistance to plasma induced damage that is equivalent to or greater than the resistance to plasma induced damage in films with a much higher total carbon content, such as films made from the prior art structure former MIPSCP.

Figure 6:
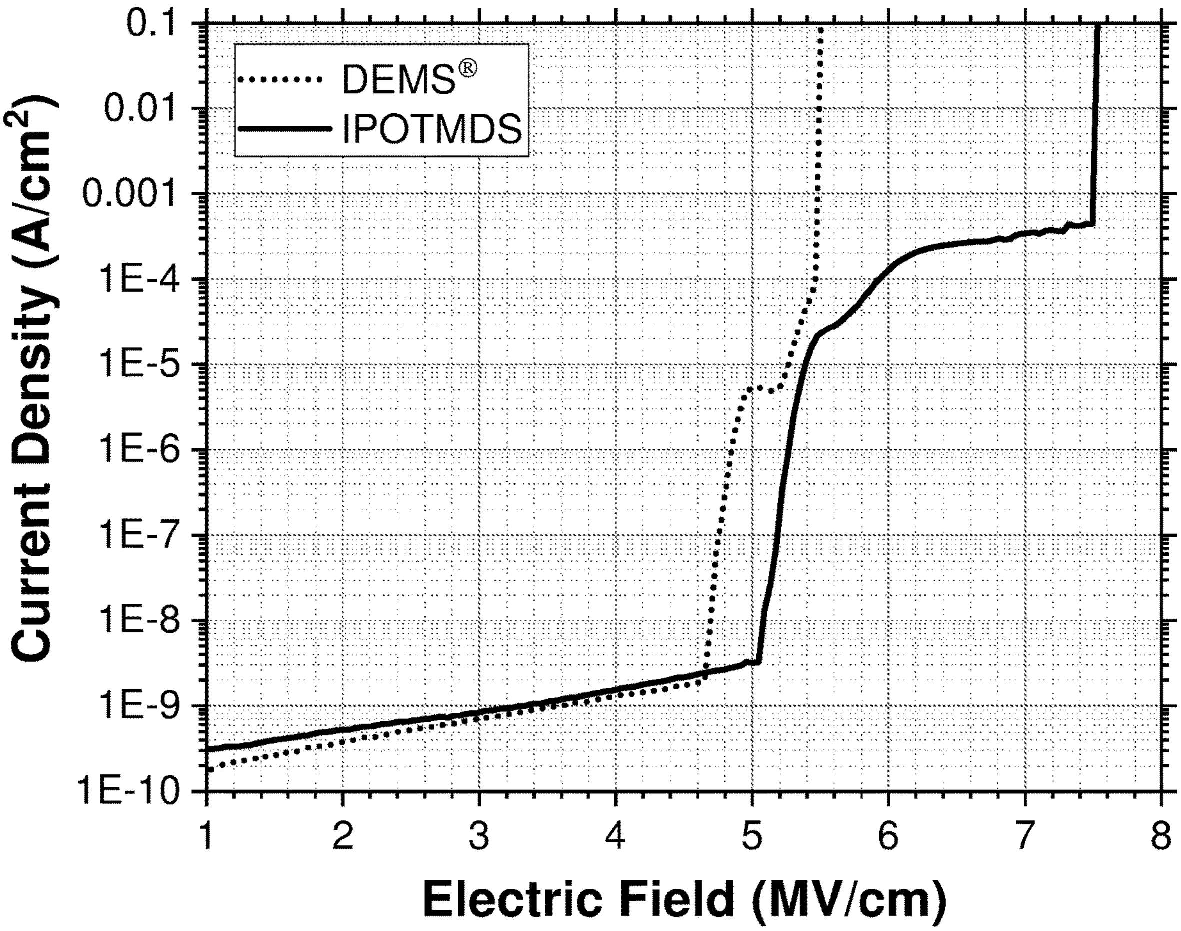
FIG. 6 shows the measured current density as a function of applied electric field strength for comparative example 3 and inventive example 1.

FIG. 6 shows the leakage current density for dense OSG films made using the DEMS® structure former and from the IPOTMDS structure former as a function of electric field strength from 1 MV/cm to 8 MV/cm. The electric field at breakdown is defined as a sudden rise in leakage current density of at least 2×. Thus, the electric field at breakdown of the film made using the IPOTMDS precursor occurs at an electric field strength of 5.0 MV/cm, while the electric field at breakdown of the film made using the DEMS® precursor occurs at an electric field strength of 4.6 MV/cm. A low dielectric constant film with the highest possible electric field at breakdown is preferred (>4 MV/cm) for integrated circuit manufacturing since the breakdown field in device structures decreases as dimensions are decreased. Higher electric field strengths at breakdown are particularly important in the lowest levels of the BEOL where the small dimensions can result in high electrical field strengths. FIG. 6 illustrates that films made using alkoxydisiloxane compounds of Formula (I) and Formula (II), such as IPOTMDS, have a higher electric field at breakdown relative to films made using prior art structure formers such as DEMS® and thus would be preferred for integrated circuit manufacturing.

The properties of the two films shown in FIG. 6 are shown in Table 3. Both films have a dielectric constant of 3.0. The film made using the IPOTMDS structure former has higher mechanical properties than the film made using the DEMS® structure former, its elastic modulus and hardness being 20% and 29% greater than the film made using the DEMS® structure former, respectively. The relative disilylmethylene ($SiCH_2Si$) density, as determined by IR spectroscopy, of the film made using the IPOTMDS structure former is 380% greater than the relative disilylmethylene density of the film made using the DEMS® structure former. The percentage of the total carbon incorporated as disilylmethylene groups is 162% greater for the film made using the IPOTMDS structure former relative to the film made using the DEMS® structure former. Thus, films made using alkoxydisiloxane compounds of Formula (I) or Formula (II), such as IPOTMDS, have unique attributes that result in a unique combination of favorable film properties: unexpectedly high resistance to plasma induced damage, unexpectedly high mechanical properties, an unexpectedly high density of $SiCH_2Si$ groups, and an unexpectedly high electric field at breakdown 5 MV/cm) relative to films deposited from prior art low k structure formers such as DEMS® or MIPSCP. Not being bound by theory, these unique film properties are attributed to a unique distribution of carbon in these films; a relatively low total carbon content (<~28 atomic %), with a high density of disilylmethylene groups (>20), and with a higher percentage of the total carbon content being comprised of disilylemethylene groups (>60) relative to films deposited from prior art low k structure formers such as DEMS® or MIPSCP. Such unique films can be deposited using the inventive alkoxydisiloxane compounds described in Formula (I) and Formula (II) such as, for example IPOTMDS and EOTMDS.

TABLE 3

Film properties of the comparative and inventive dense OSG films shown in FIG. 6.

| Parameter | DEMS ® Based Comparative Example 4 | IPOTMDS Based Inventive Example 1 |
|---|---|---|
| Dielectric Constant | 3.0 | 3.0 |
| Elastic Modulus (GPa) | 15 | 18 |
| Hardness (GPa) | 2.1 | 2.7 |
| at. % Carbon (XPS) | 14 | 25 |
| at. % Oxygen (XPS) | 51 | 39 |
| at. % Silicon (XPS) | 35 | 36 |
| Relative $SiCH_2Si$ Density* | 5 | 24 |
| Relative $Si(CH_3)_x$ Density* | 2.5 | 3.0 |
| Relative $SiCH_2Si$ Density*/(XPS C, at. %/100) | 37 | 97 |
| Electric Field at Breakdown (MV/cm) | 4.6 | 5.0 |

*As determined by IR spectroscopy.

All the film properties discussed so far refer to as deposited films. That is low k films that have not undergone any post deposition treatments, such as UV curing. As deposited films have several advantages over films that have undergone post deposition treatments. For example, post deposition treatments such as UV curing decrease throughput and add cost and complexity to the deposition process. However, it is recognized that post deposition treatments such as UV curing can be used to improve certain film properties, such as increasing the mechanical properties of an as deposited film.

The properties of an inventive dense OSG film (inventive example 5) deposited using the alkoxydisiloxane precursor structure IPOTMDS described in Formula (II) before and after UV curing are shown in Table 4. The dielectric constant of the film before and after UV curing is 3.2; that is, UV curing did not change the dielectric constant of the film. The UV cured film has higher mechanical properties than the as deposited film, its elastic modulus and hardness being 18% greater than that of the as deposited film. The relative disilylmethylene ($SiCH_2Si$) density, as determined by IR spectroscopy, of the UV cured film is 14% greater than the relative disilylmethylene density of the as deposited film. The relative $Si(CH_3)$ density, as determined by IR spectroscopy, of the UV cured film is 30% less than the relative $Si(CH_3)$ density of the as deposited film. Thus, this example illustrates that UV curing of the as deposited films can increase a films mechanical properties and $SiCH_2Si$ density and decrease its $Si(CH_3)$ density without increasing the dielectric constant of the film.

TABLE 4

Film properties of an inventive dense OSG film before and after UV curing.

| Parameter | As Deposited IPOTMDS Inventive Example 5 | UV Cured IPOTMDS Inventive Example 5 |
|---|---|---|
| Dielectric Constant | 3.2 | 3.2 |
| Elastic Modulus (GPa) | 22 | 26 |
| Hardness (GPa) | 3.4 | 4.0 |
| at. % Carbon (XPS) | 23 | <23** |
| at. % Oxygen (XPS) | 41 | Not Collected |
| at. % Silicon (XPS) | 36 | Not Collected |
| Relative $SiCH_2Si$ Density* | 21 | 24 |
| Relative $Si(CH_3)_x$ Density* | 2.4 | 1.7 |
| Relative $SiCH_2Si$ Density*/ (XPS C, at. %/100) | 93 | >93 |

*As determined by IR spectroscopy.

**The carbon content of a dense low k film decreases after UV curing.

Thus, the alkoxydisiloxane compounds given in Formula (I) and Formula (II) fulfill an urgent need for dense as deposited low k materials in integrated circuit manufacturing, particularly for lowest levels in the back end of the line. Alkoxydisiloxane compounds given in Formula (I) and Formula (II) such as, for example, IPOTMDS and EOTMDS, can be used to deposit dense low k films with the highest resistance to plasma induced damage, high mechanical strength, a high $SiCH_2Si$ density, and a high breakdown voltage (>5 MV/cm) at a given value of the dielectric constant ($k \leq 3.5$). Further, the films deposited from such precursors do not require post deposition treatment, such as UV curing, to improve the films mechanical properties or the films electrical properties. That is, the intrinsic properties of their as deposited film meet the requirements for integrated circuit manufacturing and post deposition steps (i.e., UV curing) are not required. However, UV curing can be used to further improve certain film properties if desired, such as further increasing the mechanical strength of the film without increasing its dielectric constant.

The invention claimed is:

1. A method for making a dense organosilica film, the method comprising:

providing a substrate within a reaction chamber;

introducing into the reaction chamber a gaseous composition comprising at least one alkoxydisiloxane compound having the structure given in Formula (I):

I

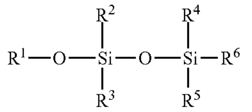

wherein $R^1$ is selected from a linear or branched $C_1$ to $C_6$ alkyl, and a cyclic $C_5$ to $C_6$ alkyl, $R^2$ is selected from hydrogen, and a linear or branched $C_1$ to $C_5$ alkyl, $R^{3-5}$ are selected independently from a linear or branched $C_1$ to $C_5$ alkyl, and $R^6$ is selected from hydrogen and a linear or branched $C_1$ to $C_5$ alkyl; and applying energy to the gaseous composition comprising the at least one alkoxydisiloxane compound in the reaction chamber to induce reaction of the gaseous composition comprising the at least one alkoxydisiloxane compound and thereby deposit an organosilica film on the substrate, wherein the organosilica film has a dielectric constant of from ~2.50 to ~3.30 and an elastic modulus of from ~6 to ~35 GPa.

2. The method of claim 1 wherein the gaseous composition is substantially free of one or more impurities selected from the group consisting of a halide, water, metals, and combinations thereof.

3. The method of claim 1 wherein the gaseous composition comprising the at least one alkoxydisiloxane compound is free of a hardening additive.

4. The method of claim 1 which is a chemical vapor deposition method.

5. The method of claim 1 which is a plasma-enhanced chemical vapor deposition method.

6. The method of claim 1 wherein the gaseous composition comprising the at least one alkoxydisiloxane compound further comprises the at least one oxidant selected from the group consisting of water vapor, water plasma, ozone, oxygen, oxygen plasma, oxygen/helium plasma, oxygen/argon plasma, nitrogen oxides plasma, carbon dioxide plasma, hydrogen peroxide, organic peroxides, and mixtures thereof.

7. The method of claim 1 wherein the gaseous composition comprising the at least one alkoxydisiloxane compound does not comprise an oxidant.

8. The method of claim 1 wherein the reaction chamber in the applying step comprises at least one gas selected from the group consisting of He, Ar, $N_2$, Kr, Xe, $CO_2$, and CO.

9. The method of claim 1 wherein the organosilica film has a refractive index (RI) of from ~1.3 to ~1.6 at 632 nm and carbon content as measured by XPS of from ~10 at. % to ~45 at. %.

10. The method of claim 1 wherein the organosilica film is deposited at a rate of from ~5 nm/min to ~2000 nm/min.

11. The method of claim 1 wherein the organosilica film has a relative disilylmethylene density from ~10 to ~40 as determined by IR spectroscopy.

12. The method of claim 1 wherein a ratio of relative density of $SiCH_2Si$ groups as determined by IR spectroscopy to a value of total carbon content of the organosilica film as measured by XPS divided by 100 is greater than or equal to 60.

13. A method for making a dense organosilica film, the method comprising:

providing a substrate within a reaction chamber;

introducing into the reaction chamber a gaseous composition comprising at least one alkoxydisiloxane compound having the structure of given in Formula (II):

II

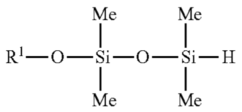

wherein $R^1$ is selected from a linear or branched $C_1$ to $C_6$ alkyl, and a cyclic $C_5$ to $C_6$ alkyl, and wherein the gaseous composition is substantially free of one or more impurities selected from the group consisting of a halide, water, metals, and combinations thereof; and applying energy to the gaseous composition comprising the alkoxydisiloxane in the reaction chamber to induce reaction of the gaseous composition comprising the alkoxydisiloxane to deposit an organosilica film on the substrate, wherein the organosilica film has a dielectric constant of from ~2.50 to ~3.30 and an elastic modulus of from ~6 to ~35 GPa.

14. The method of claim 13 wherein the gaseous composition comprising the at least one alkoxydisiloxane compound is free of a hardening additive.

15. The method of claim 13 which is a chemical vapor deposition method.

16. The method of claim 13 which is a plasma-enhanced chemical vapor deposition method.

17. The method of claim 13 wherein the gaseous composition comprising the at least one alkoxydisiloxane compound further comprises at least one oxidant selected from the group consisting of water vapor, water plasma, ozone, oxygen, oxygen plasma, oxygen/helium plasma, oxygen/argon plasma, nitrogen oxides plasma, carbon dioxide plasma, hydrogen peroxide, organic peroxides, and mixtures thereof.

18. The method of claim 13 wherein the gaseous composition comprising the at least one alkoxydisiloxane compound does not comprise an oxidant.

19. The method of claim 13 wherein the reaction chamber in the applying step comprises at least one gas selected from the group consisting of He, Ar, $N_2$, Kr, Xe, $CO_2$, and CO.

20. The method of claim 13 wherein the organosilica film has a refractive index (RI) of from ~1.3 to ~1.6 at 632 nm and carbon content as measured by XPS of from ~10 at. % to ~45 at. %.

21. The method of claim 13 wherein the organosilica film has a relative disilylmethylene density from ~10 to ~45 as determined by IR spectroscopy.

22. The method of claim 13 wherein a ratio of relative density of $SiCH_2Si$ groups as determined by IR spectroscopy to a value of total carbon content of the organosilica film as measured by XPS divided by 100 is greater than or equal to 60.

23. The method of claim 13 wherein the organosilica film has a refractive index (RI) of from ~1.3 to ~1.6 at 632 nm and nitrogen content of 0.1 at. % or less as measured by XPS or SIMS or RBS.

* * * * *